United States Patent
Maejima

(10) Patent No.: US 8,625,332 B2
(45) Date of Patent: *Jan. 7, 2014

(54) SEMICONDUCTOR MEMORY DEVICE

(71) Applicant: Kabushiki Kaisha Toshiba, Minato-ku (JP)

(72) Inventor: Hiroshi Maejima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/858,564

(22) Filed: Apr. 8, 2013

(65) Prior Publication Data

US 2013/0223130 A1    Aug. 29, 2013

Related U.S. Application Data

(63) Continuation of application No. 13/284,136, filed on Oct. 28, 2011, now Pat. No. 8,427,861, which is a continuation of application No. 12/509,690, filed on Jul. 27, 2009, now Pat. No. 8,068,358.

(30) Foreign Application Priority Data

Jul. 30, 2008 (JP) ................................. 2008-196365

(51) Int. Cl.
*G11C 11/00* (2006.01)
*G11C 7/06* (2006.01)
*G11C 8/00* (2006.01)

(52) U.S. Cl.
USPC .. 365/148; 365/163; 365/189.07; 365/230.03

(58) Field of Classification Search
USPC .................. 365/148, 163, 189.07, 230.03
See application file for complete search history.

(56) References Cited

U.S. PATENT DOCUMENTS

| 7,116,593 | B2 | 10/2006 | Hanzawa et al. |
| 8,068,358 | B2 | 11/2011 | Maejima |
| 2003/0072199 | A1 | 4/2003 | Honda et al. |
| 2007/0211551 | A1 | 9/2007 | Yogev et al. |
| 2007/0217253 | A1 | 9/2007 | Kim et al. |
| 2008/0002457 | A1 | 1/2008 | Toda et al. |

(Continued)

FOREIGN PATENT DOCUMENTS

| JP | 2007-250171 | 9/2007 |
| WO | 03/065377 | 8/2003 |

OTHER PUBLICATIONS

Japanese Office Action issued Jun. 5, 2012 in Japanese Patent Application No. 2008-196365 (w/ English Translation).

*Primary Examiner* — Ly D Pham
(74) *Attorney, Agent, or Firm* — Oblon, Spivak, McClelland, Maier & Neustadt, L.L.P.

(57) ABSTRACT

A semiconductor memory device includes a cell array having a plurality of first wirings and a plurality of second wirings intersecting each other and memory cells disposed at intersections between the plurality of first wirings and the plurality of second wirings. The semiconductor memory device further includes a control circuit for selectively driving the plurality of first wirings and the plurality of second wirings. The control circuit applies a first voltage for a first operation to a first select wiring and applies a second voltage for a second operation different from the first operation to a second select wiring and applies a third voltage for the first and second operation to a third select wiring. The first operation is completed before the second operation is completed. The control circuit applies a fourth voltage for a third operation to a forth select wiring before the second operation is completed.

4 Claims, 26 Drawing Sheets

(56) References Cited

U.S. PATENT DOCUMENTS

| | | |
|---|---|---|
| 2008/0112211 A1 | 5/2008 | Toda |
| 2008/0144363 A1 | 6/2008 | Lee et al. |
| 2008/0291740 A1 | 11/2008 | Sato et al. |
| 2008/0310211 A1 | 12/2008 | Toda et al. |
| 2009/0052234 A1 | 2/2009 | Nakai |
| 2009/0141532 A1 | 6/2009 | Nagashima et al. |
| 2009/0141567 A1 | 6/2009 | Lee et al. |
| 2009/0201710 A1 | 8/2009 | Ueda |
| 2009/0213646 A1 | 8/2009 | Choi et al. |
| 2010/0103723 A1 | 4/2010 | Kawai et al. |
| 2010/0195362 A1 | 8/2010 | Norman |
| 2010/0259966 A1 | 10/2010 | Kanzawa et al. |
| 2010/0259970 A1 | 10/2010 | Toda et al. |
| 2011/0019462 A1 | 1/2011 | Toda |
| 2011/0080778 A1 | 4/2011 | Toda |

(a) Schottky Structure (b) PN Structure (c) PIN Structure (d) MIM Structure (e) SIS Structure

SEMICONDUCTOR MEMORY DEVICE

CROSS-REFERENCE TO RELATED APPLICATION

This application is a continuation of U.S. application Ser. No. 13/284,136 filed Oct. 28, 2011, which is a continuation of U.S. application Ser. No. 12/509,690 filed Jul. 27, 2009 (Now U.S. Pat. No. 8,068,358), which is based upon and claims the benefit of priority from prior Japanese Patent Application No. 2008-196365 filed Jul. 30, 2008, the entire contents of each of which are incorporated herein by reference.

BACKGROUND OF THE INVENTION

1. Field of the Invention

The present invention relates to a nonvolatile semiconductor memory device for nonvolatilely writing data in accordance with application of a voltage to a variable resistive element.

2. Description of the Related Art

In recent years, attention has been focused on a nonvolatile memory comprising memory cells each containing a variable resistive element, which are connected at intersections of word lines and bit lines and arranged in matrix.

Known examples of the nonvolatile memory of such the type include: a PRAM (Phase-Change Random Access Memory) that uses a chalcogenide element as the variable resistive element; a ReRAM (Resistance Random Access memory) that uses a transition metal oxide element; and a CBRAM (Conductive Bridging RAM) that changes the resistance by precipitating metal cations to form a bridge between electrodes and ionizing the precipitated metal to destruct the bridge. These variable resistive memories are characterized in that the variation in resistance is stored as information.

The PCRAM utilizes the shape, such as the magnitude and the width, of a current/voltage pulse applied to the chalcogenide element to control the process from heating to cooling, thereby causing a phase change between the crystalline state and the amorphous state to control the resistance of the element (see Patent Document 1: JP 2002-541613T).

The ReRAM includes the bipolar type and the unipolar type. In the case of the biolar type, the direction of the current/voltage pulse applied to the transition metal oxide element is used to control the resistance of the element. On the other hand, in the case of the unipolar type, the magnitude and the width of the current/voltage pulse applied to the transition metal oxide element are used to control the resistance of the element.

In the case of the ReRAM of the unipolar type, data can be programmed in a variable resistive memory by applying a program voltage of around 4.0 V to the variable resistive element (actually about 6V including a voltage drop of diode) for around 10 ns, thereby changing the variable resistive element from a high-resistance state to a low-resistance state. This state change is referred to as "program" or "set". When an erase voltage of around 0.7 V is applied to the data-programmed variable resistive element (actually about 2.2 V including a voltage drop of diode) and a flow of current of 1-10 uA is applied for 200 ns to 1 us, the variable resistive element is changed from the low-resistance state to the high-resistance state. This state change is referred to as "erase" or "reset".

The memory cell has a high-resistance state as a stable state (reset state or erase state), and a low-resistance state as a set state or program state, for example. In a case of two-bit per cell, data is written by a set operation of applying a set pulse to only the cell to be programmed among the memory cells in the reset state, for example. In an erase operation, a reset pulse is applied, irrespective of the cell state (set state or reset state).

A read operation of the memory cell involves applying a voltage of 0.4V (actually about 1.9V including a voltage drop of diode) to a variable resistive element and monitoring a current flowing via the variable resistive element. Thereby, the data stored in the variable resistive element is read by detecting whether the variable resistive element is in the low-resistance state or the high-resistance state.

A certain processing time is required for performing the set operation, reset operation or read operation for a memory cell array provided on a semiconductor substrate. Particularly, the reset operation requires a longer voltage application time and takes a longer time for processing than the set operation. In a sequence control of performing the other operation (e.g., set operation) for the other memory cell array after completing the operation (e.g., reset operation) for one memory cell array, the succeeding operation waits until the preceding operation is ended.

A flash memory having a plurality of cores, each being a set of blocks in units of data erase, and capable of simultaneously performing the data write or erase operation in one core and the data read operation in the other core was described in patent application 2. However, in patent application 2, since a control circuit is provided for each core, the operation for the other memory block cannot be started until the operation for one memory block is ended in a plurality of memory blocks within the core. Also, since the memory block is a unit of data erase, the simultaneous operation is not allowed for each memory cell array within the memory block. Therefore, the time required for the operation of the semiconductor memory device is longer, whereby the processing capacity can not be increased.

BRIEF SUMMARY OF THE INVENTION

In an aspect the present invention provides a semiconductor memory device comprising: a plurality of cell arrays having a plurality of first wirings and a plurality of second wirings intersecting each other and memory cells disposed at intersections between said first wirings and said second wirings, each containing a variable resistive element that is electrically rewritable and stores a resistance value as data; and a control circuit for selectively driving said first wirings and said second wirings; wherein said control circuit performs a first operation of applying a voltage required for one operation selected from the data write, read and erase operations to said one memory cell via one combination of said first and second wirings and a second operation of applying a voltage required for an operation selected from the data write, read and erase operations and different from the first operation to said other memory cell via another combination of said first and second wirings.

In another aspect the present invention provides a semiconductor memory device according to claim 1, wherein said semiconductor memory device further comprises a comparator for reading hold data held in said memory cell and comparing said hold data and the write data written into said memory cell through said data write operation, in which said control circuit transfers to the data write operation for the next memory cell if the hold data in said memory cell compared by said comparator is matched with said write data during said data write operation into said memory cell, or performs the data write operation into said memory cell if the hold data in said memory cell compared by said comparator is not matched with said write data.

In yet another aspect the present invention provides A semiconductor memory device comprising: a plurality of cell arrays having a plurality of first wirings and a plurality of second wirings intersecting each other and memory cells disposed at intersections between said first wirings and said second wirings, each containing a variable resistive element that is electrically rewritable and stores a resistance value as data; and a control circuit for selectively driving said first wirings and said second wirings; wherein said control circuit performs a first operation of applying a voltage required for one operation selected from the data write, read and erase operations to said one memory cell via one combination of said first and second wirings and a second operation of applying a voltage required for an operation selected from the data write, read and erase operations and different from the first operation to said other memory cell via another combination of said first and second wirings.

DETAILED DESCRIPTION OF THE INVENTION

First Embodiment

A first embodiment of the invention will now be described with reference to the drawings.

[Entire Configuration]

Figure 1:
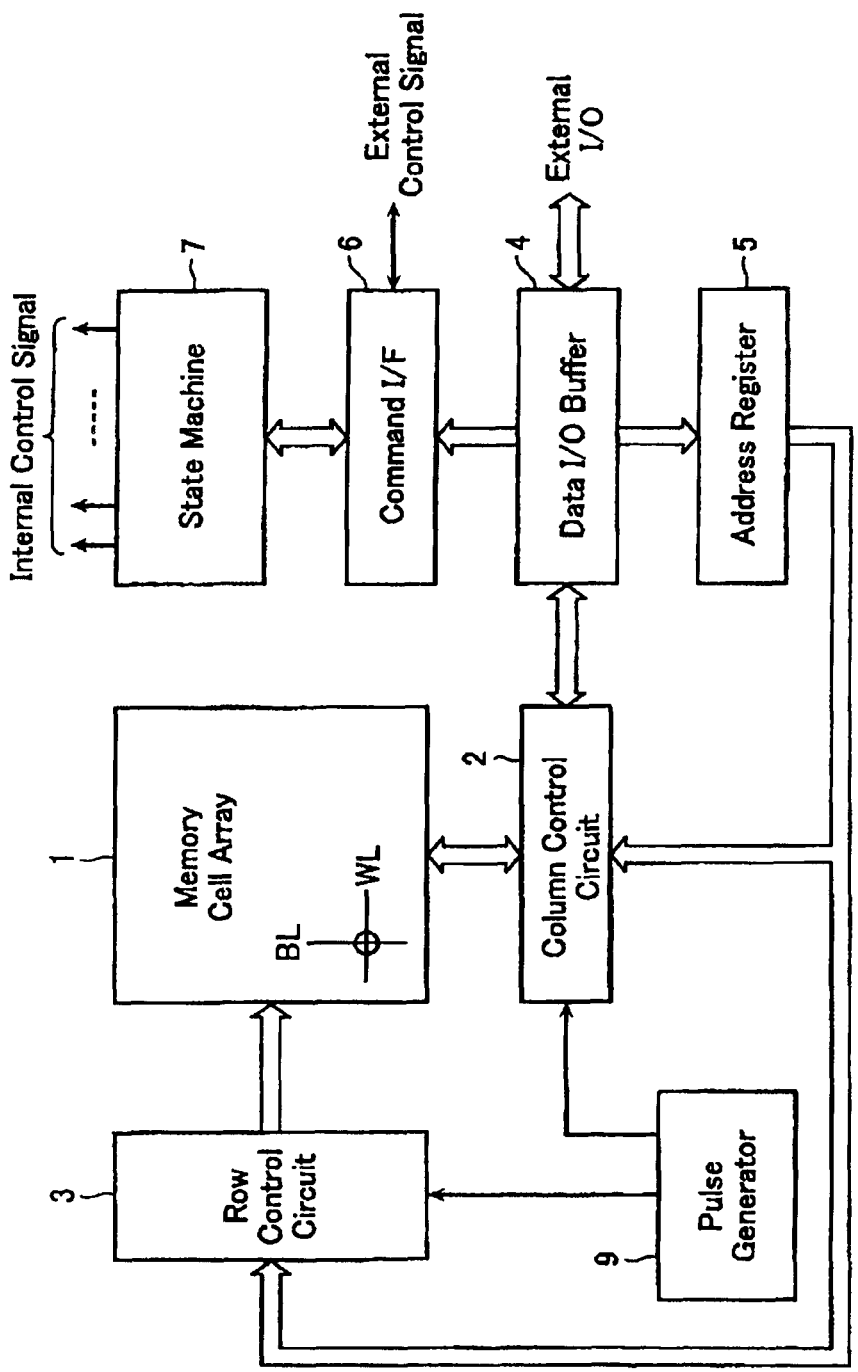
FIG. 1 is a block diagram of a nonvolatile semiconductor memory according to a first embodiment of the present invention.

FIG. 1 is a block diagram of a nonvolatile memory according to the first embodiment of the present invention.

The nonvolatile memory comprises a memory cell array 1 of memory cells arranged in matrix, each memory cell including a later-described variable resistive element, as in a PCRAM (Phase-Change RAM) and a ReRAM (Resistance RAM). A column control circuit 2 is provided on a position adjacent to the memory cell array 1 in the bit line BL direction. It controls the bit line BL in the memory cell array 1 to erase data from the memory cell, write data in the memory cell, and read data out of the memory cell. A row control circuit 3 is provided on a position adjacent to the memory cell array 1 in the word lie WL direction. It selects the word line WL in the memory cell array 1 and applies voltages required to erase data from the memory cell, write data in the memory cell, and read data out of the memory cell. The column control circuit 2 and the row control circuit 3 configure a data read/write circuit for use in data read/write to the memory cell array 1.

A data I/O buffer 4 is connected to an external host device, now shown, to receive write data, receive erase instructions, provide read data, and receive address data and command data from/to the host device. The data I/O buffer 4 sends received write data to the column control circuit 2 and receives read-out data from the column control circuit 2 and provides it to external.

An address fed from the external host device to the data I/O buffer 4 is sent via an address register 5 to the column control circuit 2 and the row control circuit 3. A command fed from the external host device to the data I/O buffer 4 is sent to a command interface 6. The command interface 6 receives an external control signal from external and decides whether the data fed to the data I/O buffer 4 is write data, a command or an address. If it is a command, then the command interface transfers it as a received command signal to a state machine 7.

The state machine 7 manages the entire nonvolatile memory to receive commands from the external host device, read, write, erase, and execute data I/O management. The external host device can also receive status information managed by the state machine 7 and decide the operation result. The status information is also utilized in control of write and erase.

The state machine 7 controls the pulse generator 9. Under this control, the pulse generator 9 is allowed to provide a pulse of any voltage at any timing. The pulse formed herein can be transferred to any line selected by the column control circuit 2 and the row control circuit 3.

Peripheral circuit elements other than the memory cell array 1 can be formed in a Si substrate immediately beneath the memory array 1 formed in a wiring layer. Thus, the chip area of the nonvolatile memory can be made almost equal to the area of the memory cell array 1.

[Memory Cell Array and Peripheral Circuits]

Figure 2:
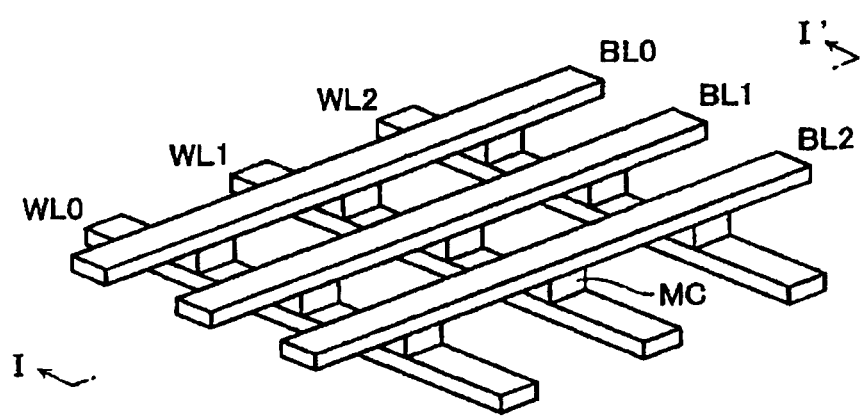
FIG. 2 is a perspective view of part of a memory cell array in the nonvolatile memory according to the first embodiment.
Figure 3:
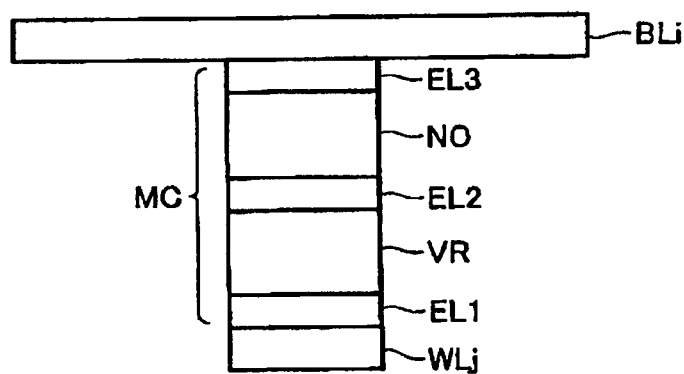
FIG. 3 is a cross-sectional view of one memory cell taken along I-I' line and seen from the direction of the arrow in FIG. 2.

FIG. 2 is a perspective view of part of the memory cell array 1, and FIG. 3 is a cross-sectional view of one memory cell taken along I–I' line and seen in the direction of the arrow in FIG. 2.

There are plural first lines or word lines WL0-WL2 disposed in parallel, which cross plural second lines or bit lines BL0-BL2 disposed in parallel. A memory cell MC is arranged at each intersection of both lines as sandwiched therebetween. Desirably, the first and second lines are composed of heat-resistive low-resistance material such as W, WSi, NiSi, CoSi.

The memory cell MC comprises a serial connection circuit of a variable resistive element VR and a non-ohmic element NO as shown in FIG. 3.

The variable resistive element VR can vary the resistance through current, heat, of chemical energy on voltage application. Arranged on an upper and a lower surface thereof are electrodes EL1, EL2 serving as a barrier metal layer and an adhesive layer. Material of the electrodes may include Pt, Au, Ag, TiAlN, SrRuO, Ru, RuN, Ir, Co, Ti, TiN, TaN, LaNiO, Al, PtIrOx, PtRhOx, Rh/TaAlN. A metal film capable of achieving uniform orientation may also be interposed. A buffer layer, a barrier metal layer and an adhesive layer may further be interposed.

Available examples of the variable resistive element VR include: one that changes the resistance in accordance with a phase change between the crystalline state and the amorphous state, such as a chalcogenide (PCRAM); one that changes the resistance by precipitating metal cations to form a bridge (contacting bridge) between electrodes and ionizing the precipitated metal to destruct the bridge (CBRAM); and one that changes the resistance by applying a voltage or current (ReRAM) (which is roughly divided into one that causes a variation in resistance in accordance with the presence/absence of charge trapped in charge traps present in the electrode interface, and one that causes a variation in resistance in accordance with the presence/absence of the conduction path due to an oxygen loss and so forth).

Figure 4:
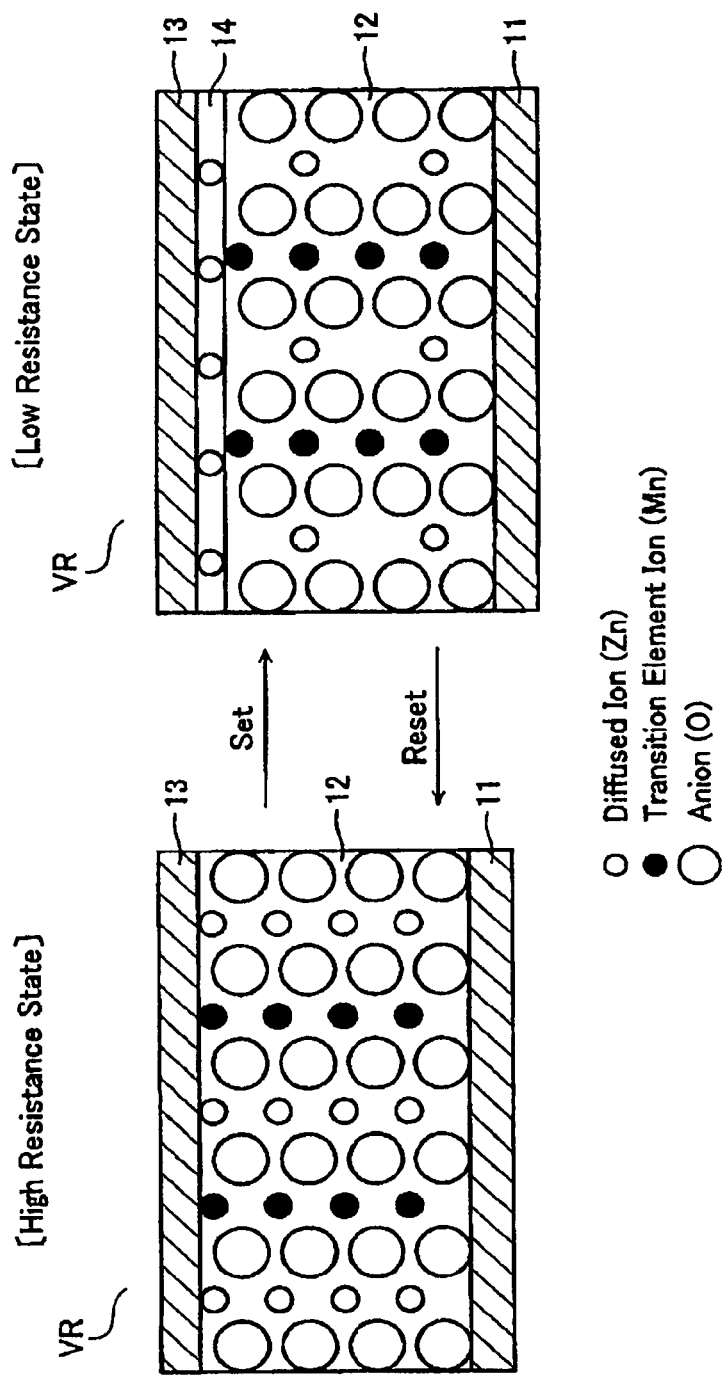
FIG. 4 is a schematic cross-sectional view showing a variable resistive element example in the first embodiment.
Figure 5:
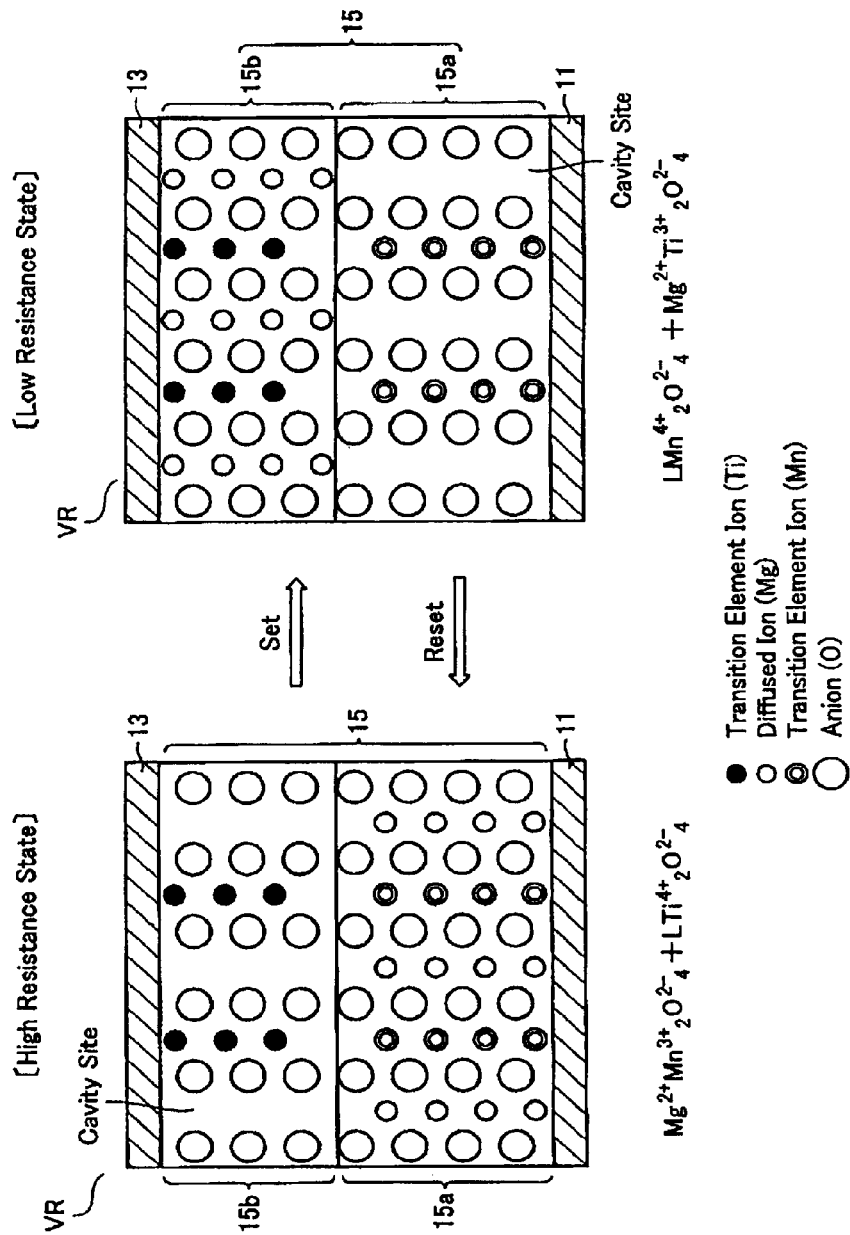
FIG. 5 is a schematic cross-sectional view showing another variable resistive element example in the first embodiment.

FIGS. 4 and 5 show example of the ReRAM. The variable resistive element VR shown in FIG. 4 includes a recording layer 12 arranged between electrode layers 11, 13. The recording layer 12 is composed of a composite compound containing at least two types of cation elements. At least one of the cation elements is a transition element having the d-orbit incompletely filled with electrons, and the shortest distance between adjacent cation element is 0.32 nm or less. Specifically, it is represented by a chemical formula $A_xM_yX_z$ (A and M are different elements) and may be formed of material having a crystal structure such as a spinel structure ($AM_2O_4$), an ilmenite structure ($AMO_3$), a delafossite structure ($AMO_2$), a LiMoN$_2$ structure ($AMN_2$), a wolframite structure ($AMO_4$), an olivine structure ($A_2MO_4$), a hollandite structure ($A_xMO_2$), a ramsdellite structure ($A_xMO_2$), and a perovskite structure ($AMO_3$).

In the example of FIG. 4, A comprises Zn, M comprises Mn, and X comprises O. In the recording layer 12, a small white circle represents a diffused ion (Zn), a large white circle represents an anion (0), and a small black circle represents a transition element ion (Mn). The initial state of the recording layer 12 is the high-resistance state. When the electrode layer 11 is kept at a fixed potential and a negative voltage is applied to the electrode layer 13, part of diffused ions in the recording layer 12 migrate toward the electrode layer 13 to reduce diffused ions the recording layer 12 relative to anions. The diffused ions arrived at the electrode layer 13 accept electrons from the electrode layer 13 and precipitate as a metal, thereby forming a metal layer 14. Inside the recording layer 12, anions become excessive and consequently increase the valence of the transition element ion in the recording layer 12. As a result, the carrier injection brings the recording layer 12 into electron conduction and thus completes setting. On regeneration, a current may be allowed to flow, of which value is very small so that the material configuring the recording layer 12 causes no resistance variation. The programmed state (low-resistance state) may be reset to the initial state (high-resistance state) by supplying a large current flow in the recording layer 12 for sufficient time, which causes Joule heating to facilitate the oxidation reduction reaction in the recording layer 12. Application of an electric field in the opposite direction from that at the time of setting may also allow resetting.

In the example of FIG. 5, a recording layer 15 sandwiched between the electrode layers 11, 13 is formed of two layers: a first compound layer 15a and a second compound layer 15b. The first compound layer 15a is arranged on the side close to the electrode layer 11 and represented by a chemical formula $A_xM1_yX1_z$. The second compound layer 15b is arranged on the side close to the electrode layer 13 and has cavity sites capable of accommodating cation elements from the first compound layer 15a.

In the example of FIG. 5, A comprises Mg, M1 comprises Mn, and X1 comprises O in the first compound layer 15a. The second compound layer 15b contains Ti shown with black circles as transition element ions. In the first compound layer 15a, a small white circle represents a diffused ion (Mg), a large white circle represents an anion (0), and a double circle represents a transition element ion (Mn). The first compound layer 15a and the second compound layer 15b may be stacked in multiple layers such as two or more layers.

In such the variable resistive element VR, potentials are given to the electrode layer 11, 13 so that the first compound layer 15a serves as an anode and the second compound layer 15b serves as a cathode to cause a potential gradient in the recording layer 15. In this case, part of diffused ions in the first compound layer 15a migrate through the crystal and enter the second compound layer 15b on the cathode side. The crystal of the second compound layer 15b includes cavity sites capable of accommodating diffused ions. Accordingly, the diffused ions moved from the first compound layer 15a are trapped in the cavity sites. Therefore, the valence of the transition element ion in the first compound layer 15a increases while the valence of the transition element ion in the second compound layer 15b decreases. In the initial state, the first and second compound layers 15a, 15b may be in the high-resistance state. In such the case, migration of part of diffused ions in the first compound layer 15a thereform into the second compound layer 15b generates conduction carriers in the crystals of the first and second compounds, and thus both have electric conduction. The programmed state (low-resistance state) may be reset to the erased state (high-resistance state 9 by supplying large current flow in the recording layer 15 for sufficient time for Joule heating to facilitate the oxidation reduction reaction in the recording layer 15, like in the preceding example. Application of an electric field in the opposite direction from that at the time of setting may also allow reset.

Figure 6:
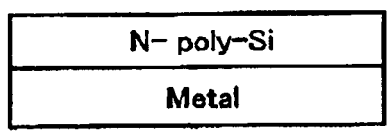
FIG. 6 is a schematic cross-sectional view showing a non-ohmic element example in the same embodiment.
Figure 6:
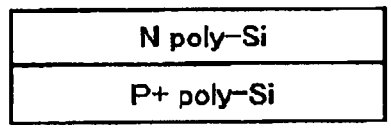
Figure 6:
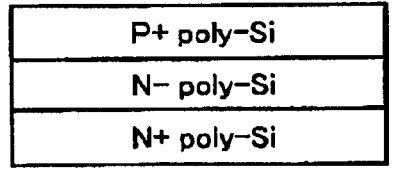
Figure 6:
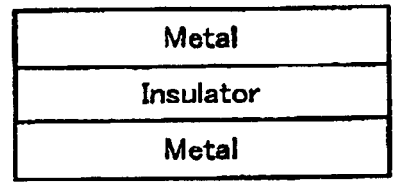
Figure 6:
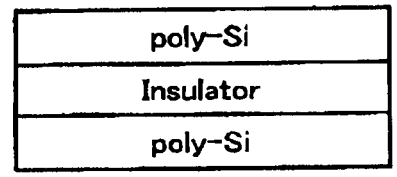

The non-ohmic element NO may include various diodes as shown in FIG. 6, for example, (a) a Schottky diode, (b) a PN-junction diode, (c) a PIN diode and may have (d) a MIM (Metal-Insulator-Metal) structure, and (e) a SIS (Silicon-Insulator-Silicon) structure. In this case, electrodes EL2, EL3 forming a barrier metal layer an and adhesive layer may be interposed. If a diode is used, from the property thereof, it can perform the unipolar operation. In the case of the MIM structure or SIS structure, it can perform the bipolar operation. The non-ohmic element NO and the variable resistive element VR may be arranged in the opposite direction compared with FIG. 3 and the polarity of the non-ohmic element NO may be inverted.

Figure 7:
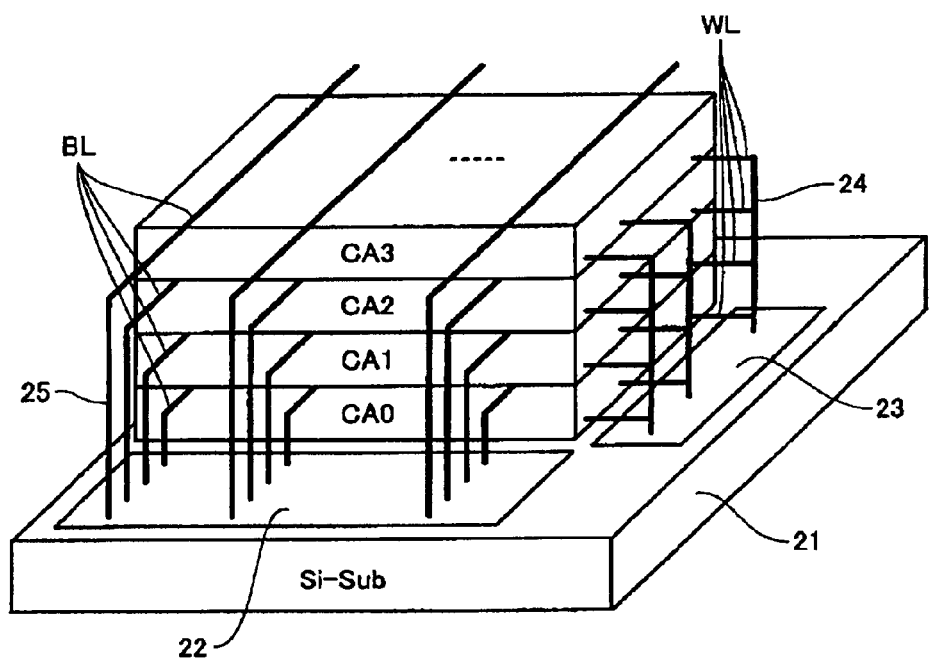
FIG. 7 is a perspective view of the memory cell array and peripheral circuit thereof according to the first embodiment.

Plural such memory structures described above may be stacked to form a three-dimensional structure as shown in FIG. 7, which shows an example of four-layered cell arrays CA0-CA3 stacked on a silicon substrate 21. Word lines WLs in the cell arrays are commonly connected through via-lines 24 and connected to a row control circuit 23 on the substrate 21. Bit lines BL0-BL3 in the cell arrays CA0-CA3 are independently connected through respective via-lines 25 to a column control circuit 22 on the substrate 21.

Figure 10:
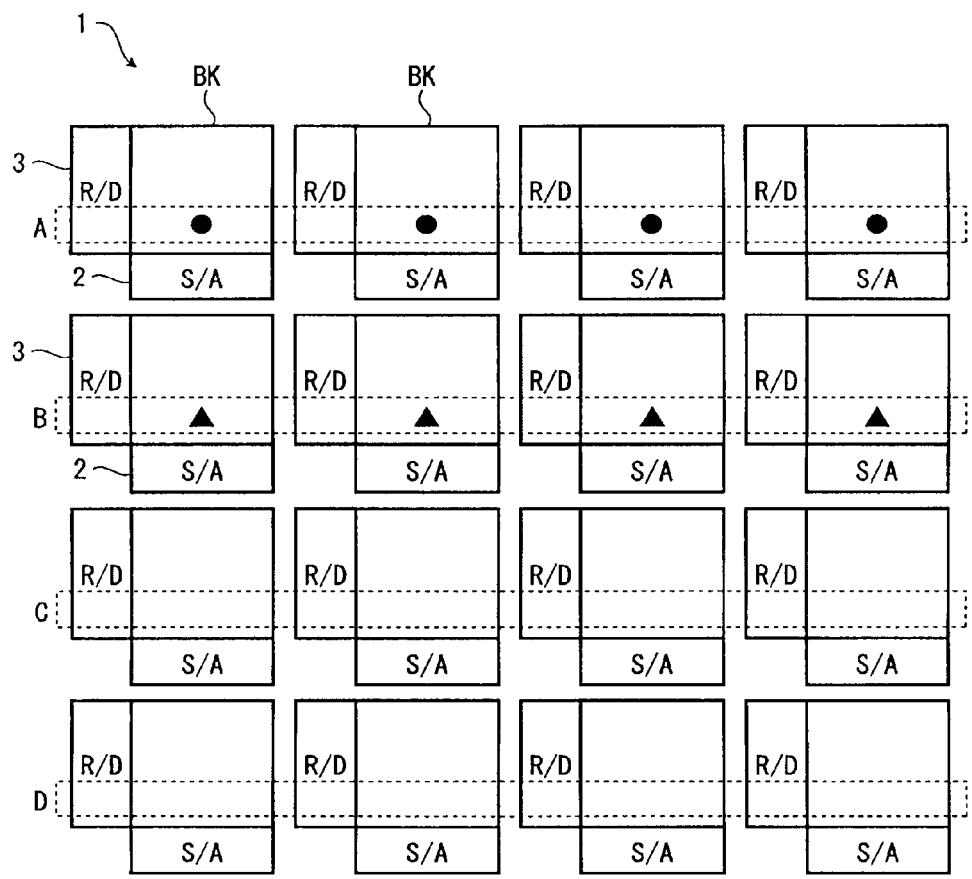
FIG. 10 is a view showing a plurality of memory cell arrays arranged in matrix on the silicon substrate according to a first embodiment.

FIG. 10 is an equivalent circuit diagram showing details of the memory cell array 1 of FIG. 1. A diode SD is herein used as the non-ohmic element NO and, for simplicity of description, it is assumed to have a single-layered structure to advance the description.

Figure 8:
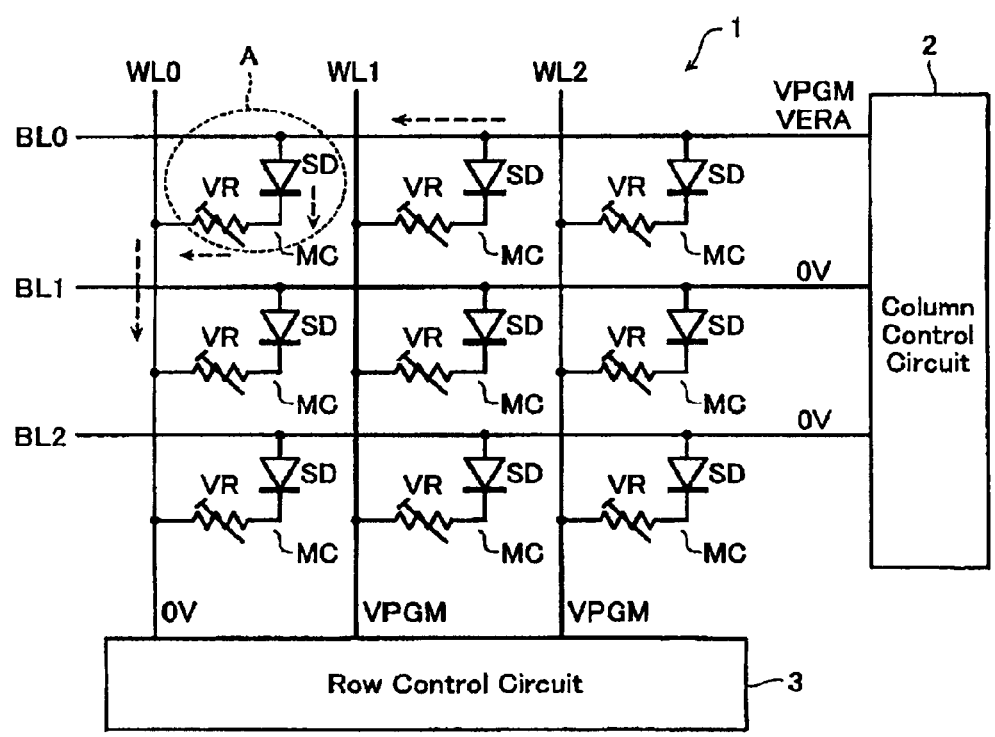
FIG. 8 is a circuit diagram of the memory cell array and peripheral circuits thereof according to the first embodiment.
Figure 9:
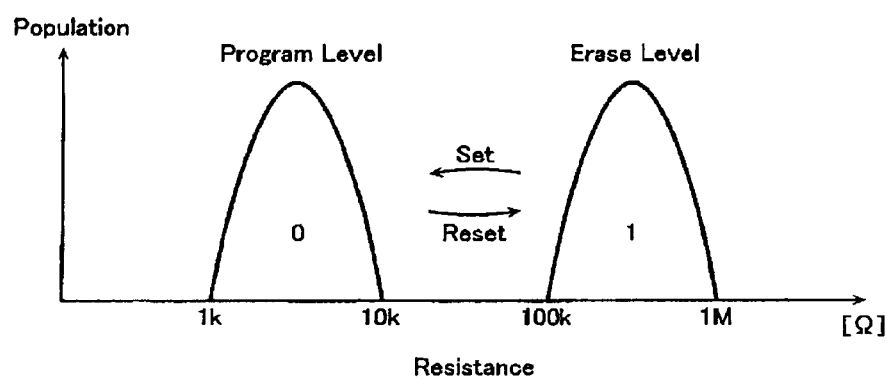
FIG. 9 is a graph showing a relation between resistance distributions and data among memory cells in the case of binary data.

In FIG. 8, a memory cell MC in the memory cell array MA includes a diode SD and a variable resistive element VR connected in series. The diode SD has an anode connected to a bit line BL and a cathode connected via the variable resistive element VR to a word line WL. Each bit line BL has one end connected to the column control circuit 2. Each word line WL has one end connected to the row control circuit 3.

The memory cell MC may be selected individually. Alternatively, data in plural memory cells MC connected to the selected word line WL1 may be read out together in another mode. The memory cell array 1 may be configured such that current flows from the word line WL to the bit line BL with the inverted polarity of the diode SD compared to the circuit of FIG. 8.

[Operation of Nonvolatile Memory]

The following description is given to operation of the nonvolatile semiconductor memory thus configured.

In this example, a memory cell MC connected to a word line WL0 and a bit line BL0 is assumed as a selected cell A shown with a dotted circle in FIG. 8 and subjected to data erase and program. Data erase can be executed by resetting, that is, applying 0V to the word line WL0 and an erase voltage VERA of, for example, around 2.0 V to the bit line BL0 to supply a current of 1-10 uA only for 200 nm to 1 us. Data write (program) in the variable resistive element VR can be executed by such processing as applying 0V to the word line WL0 and a program voltage VPGM of, for example, around 6.0 V (with a current value of around 10 nA) to the bit line BL0 only for 10-100 ns to shift the resistance of the variable resistive element VR into the low-resistance range. Data erase corresponds to "1"-data programming of resetting while data write corresponds to "0"-data programming or setting. The resistance of the variable resistive element VR contained in the memory cell MC distributes over a high-resistance range of 100 K?? to 1 M?? in the erased state and over a low-resistance range of 1-10 K? in the written (programmed) state.

[Operation of Variable Resistive Memory Device]

Herein, a reset pulse applied to the bit line BL during a data erase operation can be applied so that the current value and application time may increase as the number of writing or erasing data into or from a memory cell MC is larger. Also, a set pulse applied to the bit line BL during a data set operation can be applied so that the voltage value may increase as the number of writing or erasing data into or from the memory cell MC is larger.

Next, the set operation and the reset operation for the memory cell array 1 of the variable resistive memory device will be described below. Herein, the set operation and the reset operation are performed with a plurality of memory blocks BK selected simultaneously as a basic unit. Also, when the set operation is performed, a reset pulse is applied in advance to every memory cell MC within the memory cell array 1, so that every memory cell MC within the memory cell array 1 is put in a reset state. Thereafter, a set pulse is applied to only the memory cell MC designated by an address signal. Thereby, data is written into the memory cell array 1.

In FIG. 10, the memory cell within the memory block BK for which the reset operation is performed is indicated by the circle sign and the memory cell for which the set operation is performed is indicated by the triangle sign. Also, a plurality of memory blocks BK selected by an address signal A are indicated by the broken line. Similarly, a plurality of memory cell arrays selected by the address signals B, C and D are indicated by the broken lines B, C and D.

Figure 11:
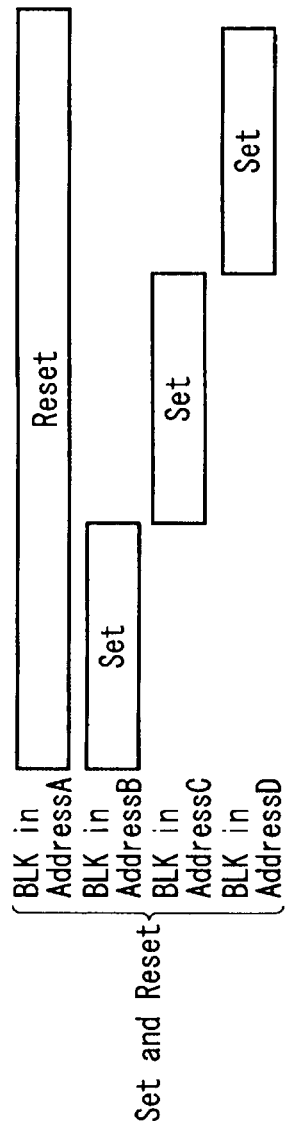
FIG. 11 is a schematic view showing the operation performed for the memory cell array in a variable resistive memory device according to the first embodiment.
Figure 12:
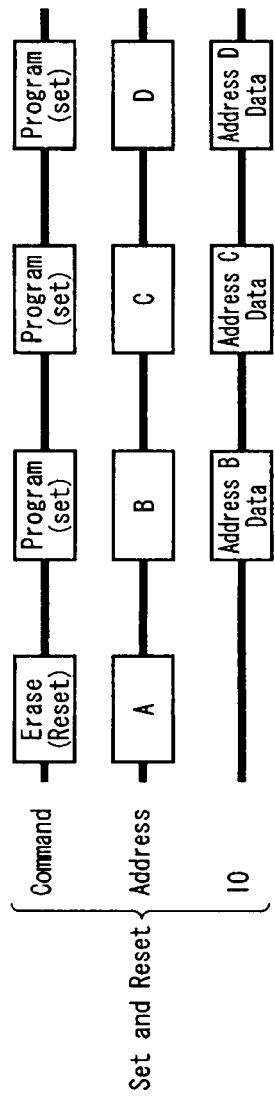
FIG. 12 is a schematic view showing a signal inputted or outputted into or from a control circuit in the variable resistive memory device according to the first embodiment.

FIG. 11 is a view typically showing the operation performed for the memory block BK at each address during the set operation and the reset operation in the variable resistive memory device having a structure as shown in FIG. 10. FIG. 12 is a view typically showing a control signal, an address signal and data inputted or outputted into or from a control signal line, an address signal line or a data input/output line 10 during the set operation and the reset operation in the variable resistive memory device having the structure as shown in FIG. 10. Herein, the horizontal direction represents the time elapsed in FIGS. 11 and 12.

In the set operation and the reset operation for the variable resistive memory device as shown in FIG. 12, first of all, a signal designating the address A is supplied via the address signal line to a column control circuit 2 and a row control circuit 3. The address signal A designates the memory block BK and the memory cell MC by combination of the bit line BL and the word line WL for the memory block BK. At the same time, a signal dictating the reset operation is supplied via the control signal line to the column control circuit 2 and the row control circuit 3. Herein, since the reset operation is the operation for applying the reset pulse, irrespective of the cell state (set state or reset state), it is not required to send data via the data input/output line 10.

Next, a signal designating the address B is supplied via the address signal line to the column control circuit 2 and the row control circuit 3, and a signal dictating the set operation is supplied via the control signal line to the column control circuit 2 and the row control circuit 3. The address signal B designates the memory block BK and the memory cell MC by combination of the bit line BL and the word line WL for the memory block BK. Also, data written via the data input/output line IO into the memory block BK designated by the address B is supplied to the column control circuit 2 and the row control circuit 3. Since it is unnecessary to use the data input/output line IO in the reset operation, data written into the memory block BK using the data input/output line IO during the set operation can be sent to the column control circuit 2 and the row control circuit 3.

Thereby, the reset operation for a plurality of memory blocks BK selected by the address signal A and the set operation for a plurality of memory blocks BK selected by the address signal B are performed at the same time, as shown in FIGS. 10 and 11. In the set operation and the reset operation for the variable resistive memory device, the same operation (e.g., reset operation) is performed for the plurality of memory blocks BK selected by the address signal A in parallel, as shown in FIG. 10. Also, the same operation (e.g., set operation) is performed for the plurality of memory blocks BK selected by the address signal B in parallel.

Thereafter, a signal designating the address C is supplied via the address signal line to the column control circuit 2 and the row control circuit 3, and a signal dictating the set operation is supplied via the control signal line to the column control circuit 2 and the row control circuit 3, as shown in FIG. 12. The address signal C designates the memory block BK and the memory cell MC by combination of the bit line BL and the word line WL for the memory block BK. Also, data written via the data input/output line IO into the memory block BK at the address C is supplied via the data input/output line IO into the column control circuit 2 and the row control circuit 3.

Since the time required for the set operation is shorter than the time required for the reset operation, as shown in FIG. 11, the set operation for the memory block BK at the address B is ended before the reset operation for the memory block BK at the address A. After the set operation for the plurality of memory blocks BK selected by the address signal B is ended, the set operation for the plurality of memory blocks BK selected by the address signal C is performed. In the following, the set operation for the memory block BK at the address C and the set operation for the memory block BK at the address D are performed successively, as shown in FIGS. 10 and 11.

In this way, in the variable resistive memory device according to this embodiment, the reset operation is performed for the memory block BK at the address A, and simultaneously in parallel, the set operation is performed for the memory blocks BK at the addresses B, C and D. The set operation does not wait until the reset operation is completed, whereby the time required for the operation of the variable resistive memory device can be shortened. That is, the variable resistive memory device according to this embodiment can increase the processing speed in performing the set operation and the reset operation for the memory cell array 1.

Second Embodiment

A basic configuration of the variable resistive memory device according to a second embodiment is the same as the variable resistive memory device according to the first embodiment.

[Operation of Variable Resistive Memory Device]

The reset operation and the read operation for a plurality of memory blocks BK in the variable resistive memory device according to the second embodiment will be described below. Herein, the reset operation and the read operation are performed with the plurality of memory blocks BK selected simultaneously as a basic unit, as in the first embodiment.

Figure 13:
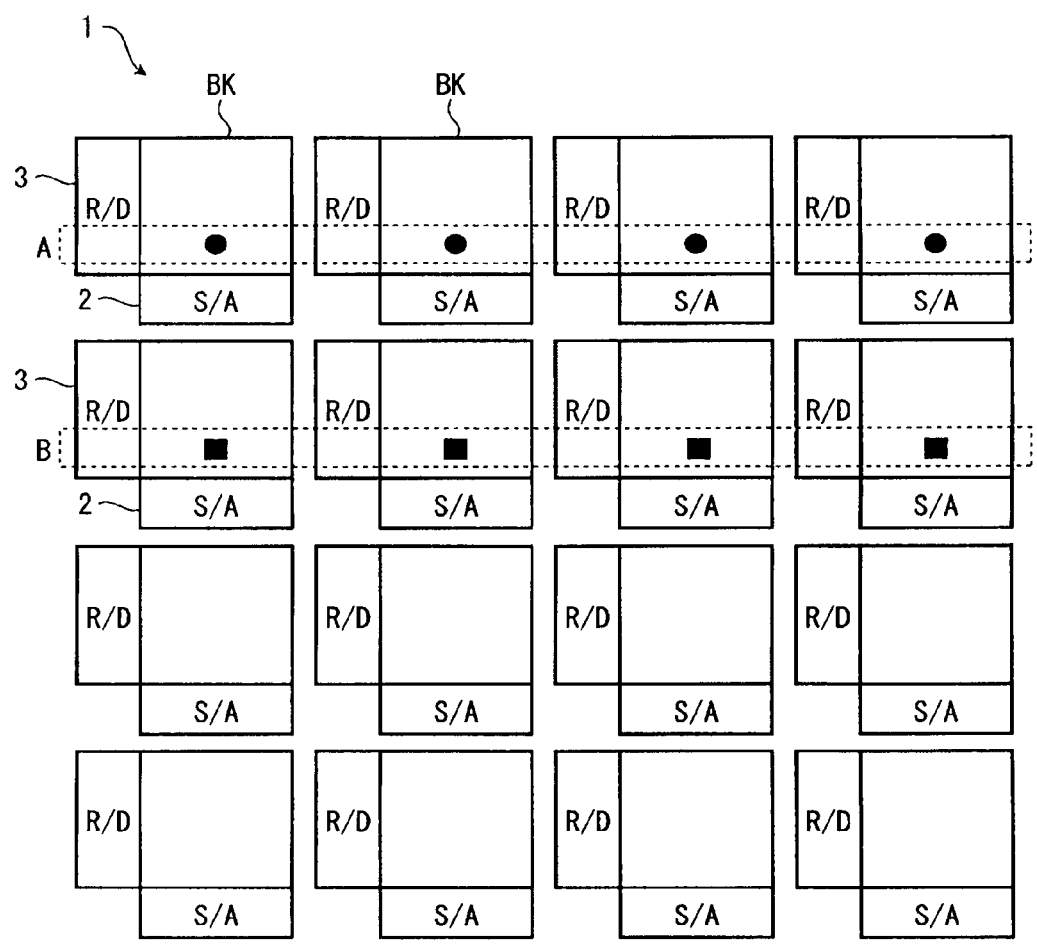
FIG. 13 is a schematic view showing a plurality of memory cell arrays arranged in matrix on the silicon substrate according to a second embodiment.

FIG. 13 is a view showing the plurality of memory blocks BK arranged in matrix on a silicon substrate. In the memory cell array 1 as shown in FIG. 13, the same reference signs are attached to the parts having the same configuration as the first embodiment, the explanation of which is omitted.

Figure 14:
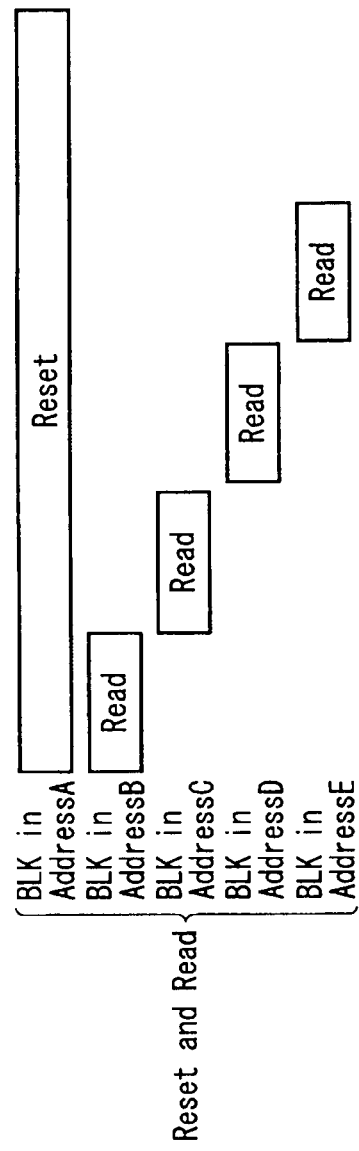
FIG. 14 is a schematic view showing the operation performed for the memory cell array in the variable resistive memory device according to the second embodiment.
Figure 15:
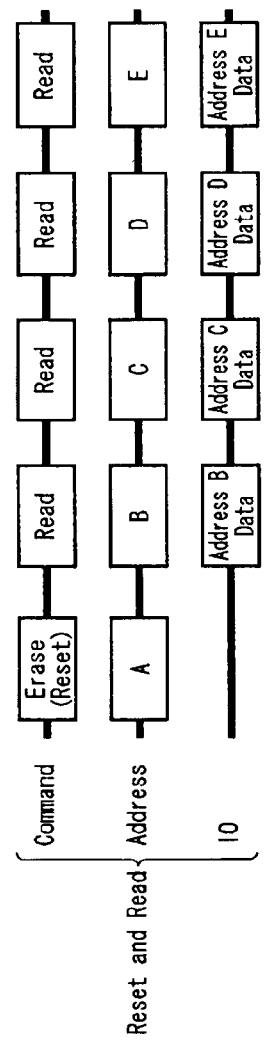
FIG. 15 is a schematic view showing a signal inputted or outputted into or from the control circuit in the variable resistive memory device according to the second embodiment.

In FIG. 13, the memory cell within the memory block BK for which the reset operation is performed is indicated by the circle sign and the memory cell for which the read operation is performed is indicated by the rectangle sign. FIG. 14 is a view typically showing the operation performed for the memory block BK at each address during the reset operation and the read operation for the variable resistive memory device having a structure as shown in FIG. 13. FIG. 15 is a view typically showing a control signal, an address signal and data inputted or outputted into or from the column control circuit 2 and the row control circuit 3 during the reset operation and the read operation for the variable resistive memory device having the structure as shown in FIG. 13.

In the read operation and the reset operation for the variable resistive memory device as shown in FIG. 15, first of all, a signal designating the address A is supplied via the address signal line to the column control circuit 2 and the row control circuit 3. The address signal A designates the memory block BK and the memory cell MC by combination of the bit line BL and the word line WL for the memory block BK. At the same time, a signal dictating the reset operation is supplied via the control signal line to the column control circuit 2 and the row control circuit 3. Herein, since the reset operation is the operation for applying the reset pulse, irrespective of the cell state (set state or reset state), it is not required to send data via the data input/output line IO.

Next, a signal designating the address B is supplied via the address signal line to the column control circuit 2 and the row control circuit 3, and a signal dictating the read operation is supplied via the control signal line to the column control circuit 2 and the row control circuit 3. The address signal B designates the memory block BK and the memory cell MC by combination of the bit line BL and the word line WL for the memory block BK. Also, data read from the memory block BK designated by the address B is supplied to the column control circuit 2 and the row control circuit 3, and outputted via the data input/output line IO to external. Since it is unnecessary to use the data input/output line IO during the reset operation, data read from the memory block BK using the data input/output line IO during the read operation can be sent to the column control circuit 2 and the row control circuit 3.

Thereby, the reset operation for a plurality of memory blocks BK selected by the address signal A and the read operation for a plurality of memory blocks BK selected by the address signal B are performed at the same time, as shown in FIG. 14. In the reset operation and the read operation for the variable resistive memory device, the same operation (e.g., reset operation) is performed for the plurality of memory blocks BK selected by the address signal A in parallel, as shown in FIG. 13. Also, the same operation (e.g., read operation) is performed for the plurality of memory blocks BK selected by the address signal B in parallel.

Thereafter, a signal designating the address C is supplied via the address signal line to the column control circuit 2 and the row control circuit 3, and a signal dictating the read operation is supplied via the control signal line to the column control circuit 2 and the row control circuit 3, as shown in FIG. 15. The address signal C designates the memory block BK and the memory cell MC by combination of the bit line BL and the word line WL for the memory block BK. Also, data read from the memory block BK at the address C is supplied into the column control circuit 2 and the row control circuit 3, and outputted via the data input/output line IO to external.

Since the time required for the read operation is shorter than the time required for the reset operation, as shown in FIG. 14, the read operation for the address B is ended before the reset operation for the memory block BK at the address A. After the read operation for the plurality of memory blocks BK selected by the address signal B is ended, the read operation for the plurality of memory blocks BK selected by the address signal C is performed. In the following, the read operation for the memory block BK at the address C and the read operation for the memory block BK at the address D are performed successively, as shown in FIGS. 14 and 15.

In this way, in the variable resistive memory device according to this embodiment, the reset operation is performed for the memory block BK at the address A, and simultaneously in parallel, the read operation is performed for the memory blocks BK at the addresses B, C and D. The read operation does not wait until the reset operation is completed, whereby the time required for the operation of the variable resistive memory device can be shortened. That is, the variable resistive memory device according to this embodiment can increase the processing speed in performing the reset operation and the read operation for the memory cell array 1. Herein, since the time required for the read operation is shorter than the time required for the set operation as shown in the first embodiment, the read operation for the memory block BK at the address E may be further performed after the read operation for the memory block BK at the address D is performed.

Third Embodiment

A basic configuration of the variable resistive memory device according to a third embodiment is the same as the variable resistive memory device according to the first embodiment.

[Operation of Variable Resistive Memory Device]

The set operation and the read operation for the memory cell array 1 in the variable resistive memory device according to the third embodiment will be described below. Herein, the set operation and the read operation are performed with a plurality of memory blocks BK selected simultaneously as a basic unit, as in the first and second embodiments.

Figure 16:
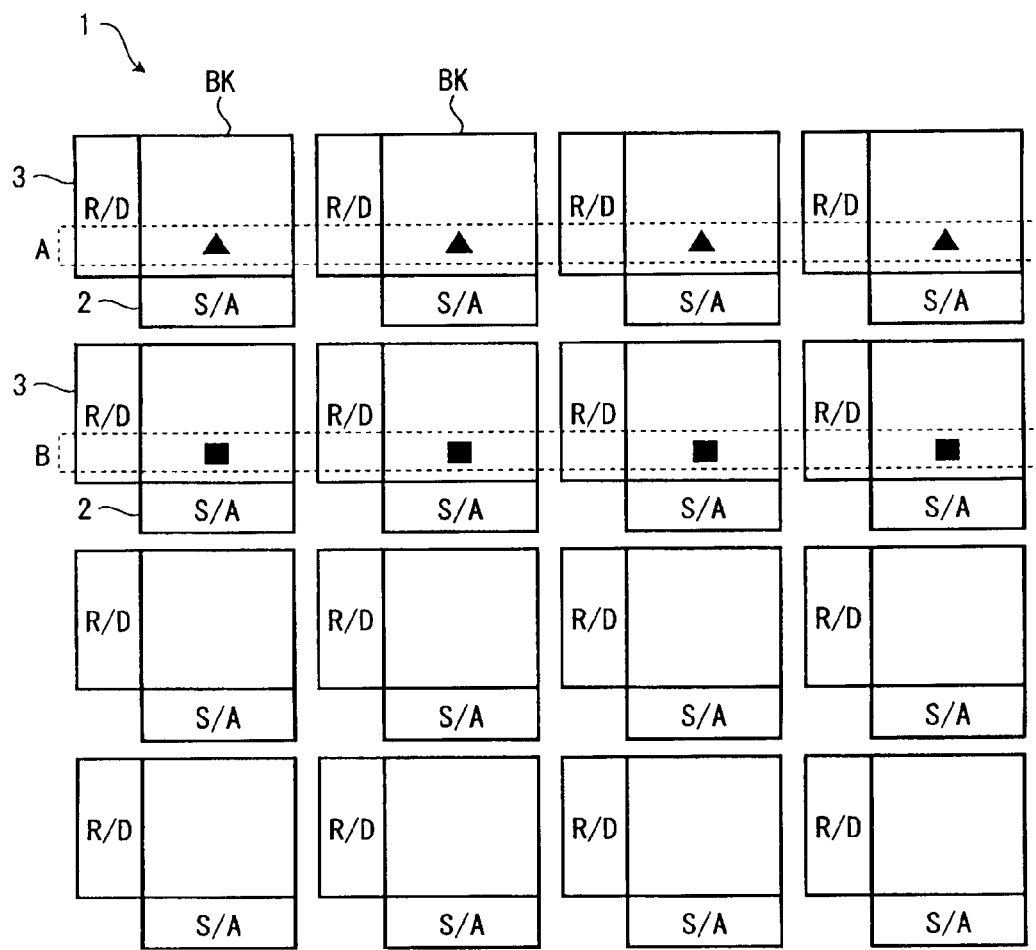
FIG. 16 is a schematic view showing a plurality of memory cell arrays arranged in matrix on the silicon substrate according to a third embodiment.

FIG. 16 is a view showing the plurality of memory blocks BK arranged in matrix on a silicon substrate. In the memory cell array 1 as shown in FIG. 16, the same reference signs are attached to the parts having the same configuration as the first embodiment, the explanation of which is omitted.

Figure 17:
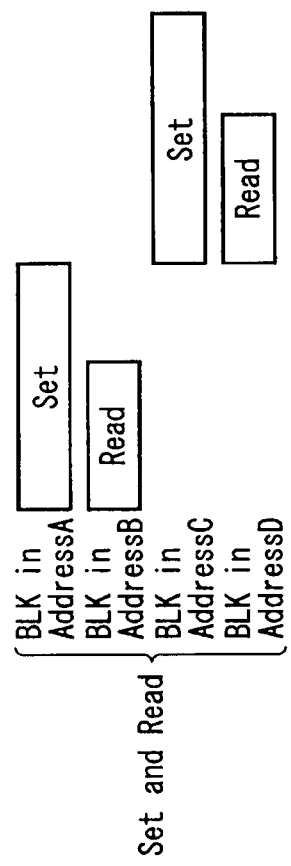
FIG. 17 is a schematic view showing the operation performed for the memory cell array in the variable resistive memory device according to the third embodiment.
Figure 18:
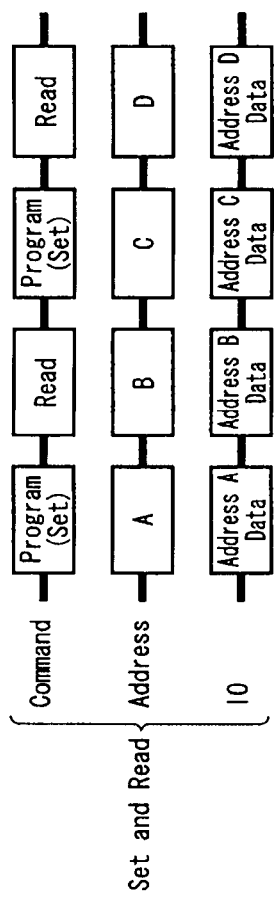
FIG. 18 is a schematic view showing a signal inputted or outputted into or from the control circuit in the variable resistive memory device according to the third embodiment.

In FIG. 16, the memory cell within the memory block BK for which the set operation is performed is indicated by the triangle sign and the memory cell for which the read operation is performed is indicated by the rectangle sign. FIG. 17 is a view typically showing the operation performed for the memory block BK at each address during the set operation and the read operation in the variable resistive memory device having a structure as shown in FIG. 16. FIG. 18 is a view typically showing a control signal, an address signal and data inputted or outputted into or from the column control circuit 2 and the row control circuit 3 during the set operation and the read operation for the variable resistive memory device having the structure as shown in FIG. 16.

In the set operation and the read operation for the variable resistive memory device as shown in FIG. 18, first of all, a signal designating the address A is supplied via the address signal line to the column control circuit 2 and the row control circuit 3, and a signal dictating the set operation is supplied via the control signal line to the column control circuit 2 and the row control circuit 3. The address signal A designates the memory block BK and the memory cell MC by combination of the bit line BL and the word line WL for the memory block BK. Also, data written into the memory block BK designated by the address B is supplied via the data input/output line IO to the column control circuit 2 and the row control circuit 3.

Next, a signal designating the address B is supplied via the address signal line to the column control circuit 2 and the row control circuit 3, and a signal dictating the read operation is supplied via the control signal line to the column control circuit 2 and the row control circuit 3. The address signal B designates the memory block BK and the memory cell MC by combination of the bit line BL and the word line WL for the memory block BK. Also, data read from the memory block BK designated by the address B is supplied to the column control circuit 2 and the row control circuit 3, and outputted via the data input/output line IO to external. In this embodiment, it is required to sent data via the data input/output line IO for the set operation and the read operation. To perform the set operation and the read operation simultaneously, a plurality of data input/output lines IO may be provided, or input/output data may be transferred in time division.

Thereby, the set operation for a plurality of memory blocks BK selected by the address signal A and the read operation for a plurality of memory blocks BK selected by the address signal B are performed at the same time, as shown in FIG. 17. In the set operation and the read operation for the variable resistive memory device, the same operation (e.g., set operation) is performed for the plurality of memory blocks BK selected by the address signal A in parallel, as shown in FIG. 16. Also, the same operation (e.g., read operation) is performed for the plurality of memory blocks BK selected by the address signal B in parallel.

Thereafter, a signal designating the address C is supplied via the address signal line to the column control circuit 2 and the row control circuit 3, and a signal dictating the set operation is supplied via the control signal line to the column control circuit 2 and the row control circuit 3, as shown in FIG. 18. The address signal C designates the memory block BK and the memory cell MC by combination of the bit line BL and the word line WL for the memory block BK. Also, data written into the memory block BK designated by the address C is supplied via the data input/output line IO to the column control circuit 2 and the row control circuit 3.

Simultaneously, a signal designating the address D is supplied via the address signal line to the column control circuit 2 and the row control circuit 3, and a signal dictating the read operation is supplied via the control signal line to the column control circuit 2 and the row control circuit 3. The address signal D designates the memory block BK and the memory cell MC by combination of the bit line BL and the word line WL for the memory block BK. Also, data read from the memory block BK at the address D is supplied to the column control circuit 2 and the row control circuit 3, and outputted via the data input/output line IO to external.

Thereby, after the set operation for the memory block BK at the address A and the read operation for the memory block BK at the address B are ended, the set operation for the memory block BK at the address C and the read operation for the memory block BK at the address D are performed successively.

In this way, in the variable resistive memory device according to this embodiment, the set operation is performed for the memory block BK at the address A or C, and simultaneously in parallel, the read operation is performed for the memory block BK at the address B or D. The read operation does not wait until the set operation is completed, whereby the time required for the operation of the variable resistive memory device can be shortened. That is, the variable resistive memory device according to this embodiment can increase the processing speed in performing the set operation and the read operation for the memory cell array 1.

Fourth Embodiment

A basic configuration of the variable resistive memory device according to a fourth embodiment is the same as the variable resistive memory device according to the first embodiment.

[Operation of Variable Resistive Memory Device]

The set operation and the reset operation for the memory cell array 1 in the variable resistive memory device according to the fourth embodiment will be described below. The operation of the variable resistive memory device according to the first to third embodiments was performed with a plurality of memory blocks BK selected simultaneously as a basic unit. On the contrary, the variable resistive memory device according to this embodiment is different from the first to third embodiments in that the plurality of memory cells selected simultaneously within one memory block BK is the basic unit. That is, the variable resistive memory device according to this embodiment performs the set operation and the reset operation for the plurality of memory cells within one memory block BK.

Figure 19:
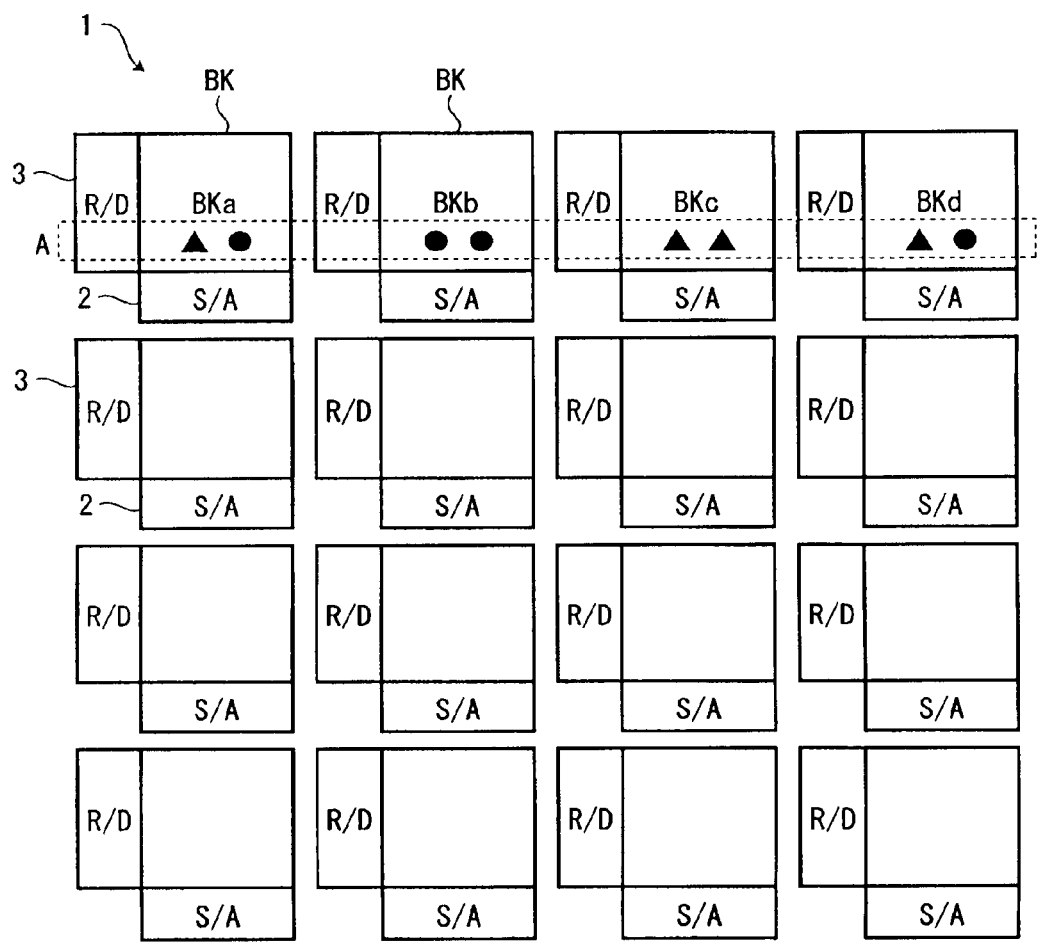
FIG. 19 is a view showing a plurality of memory cell arrays arranged in matrix on the silicon substrate according to a fourth embodiment.

FIG. 19 is a view showing the plurality of memory blocks BK arranged in matrix on a silicon substrate. In the memory cell array 1 as shown in FIG. 19, the same reference signs are attached to the parts having the same configuration as the first embodiment, the explanation of which is omitted. In FIG. 19, the memory cell within the memory block BK for which the reset operation is performed is indicated by the circle sign and the memory cell for which the set operation is performed is indicated by the triangle sign.

In the set operation and the reset operation for the variable resistive memory device as shown in FIG. 19, the set operation and the reset operation are performed for the plurality of memory blocks BK selected by the address signal A. In one memory block $BK_b$, the same operation (e.g., reset operation) is performed for the different memory cells in parallel. Also, in the other memory block $BK_c$, the same operation (e.g., set operation) is performed for the different memory cells in parallel. And in the other memory blocks $BK_a$ and $BK_d$, the different operations (e.g., set operation and reset operation) are performed for the different memory cells. The set operation and the reset operation for the plurality of memory blocks BK selected by the address signal A are performed at the same time, as shown in FIG. 19.

Herein, since the time required for the set operation is shorter than the time required for the reset operation, the set operation for another memory cell is ended before the reset operation for one memory cell. In this case, a signal designating another memory cell is supplied via the address signal line to the column control circuit 2 and the row control circuit 3, and a signal dictating the set operation is supplied via the control signal line to the column control circuit 2 and the row control circuit 3. Also, data written into another memory cell is supplied via the data input/output line IO to the column control circuit 2 and the row control circuit 3. Thereby, the set operation for the different memory cell from the memory cell for which the reset operation is performed is performed successively.

In this way, in the variable resistive memory device according to this embodiment, the reset operation is performed for one memory cell, and the set operation is performed for another memory cell. The set operation does not wait until the reset operation is completed, whereby the time required for the operation of the variable resistive memory device can be shortened. That is, the variable resistive memory device according to this embodiment can increase the processing speed in performing the set operation and the reset operation for the memory blocks BK.

[Configuration of Control Circuit]

Figure 20:
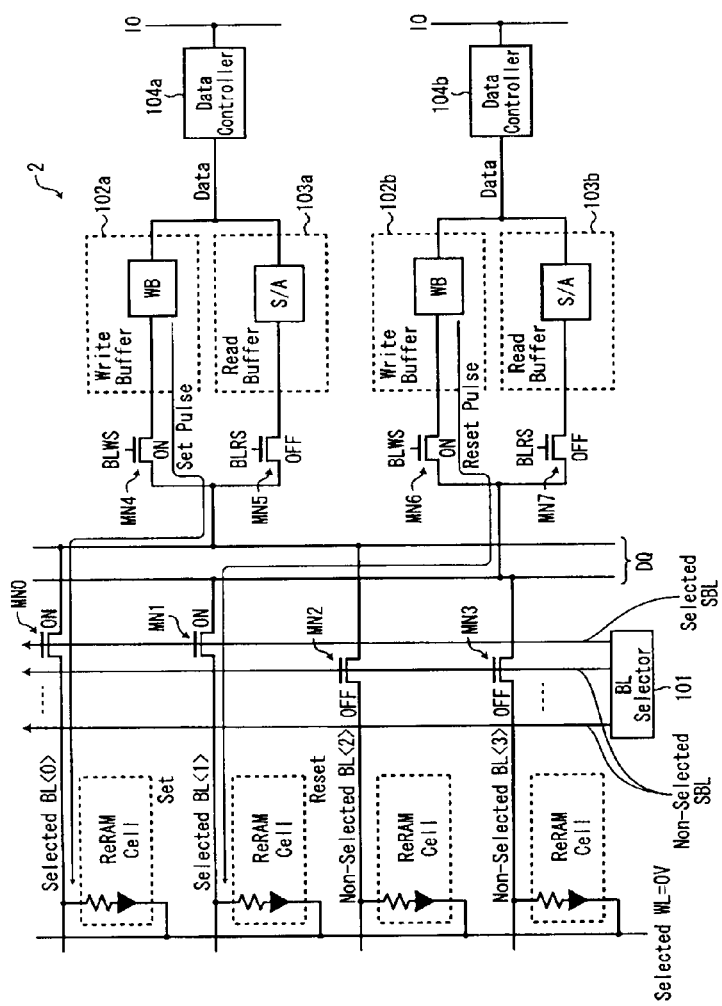
FIG. 20 is a circuit diagram showing the configuration of a column control circuit according to the fourth embodiment.

The configuration of a control circuit for performing such operation for the memory cell array 1 will be described below. FIG. 20 shows the configuration of the column control circuit 2 comprising a read/write circuit. Each bit line BL is connected to the selection NMOS transistors MN0 to MN3. The column control circuit 2 has a bit line selector 101 for selecting the bit line BL by selectively turning on the selection transistors MN0 to MN3. The bit line selector 101 selectively makes the selection transistors MN0 to MN3 conductive according to a selection signal of a bit line selection line SBL, and thereby selectively drives two of the four bit lines BL <0> to <3>, as one example. Herein, the selection NMOS transistors MN0 to MN3 are high withstand voltage transistors. Herein, for simplicity, two of the four bit lines are selected by way of example.

Also, the column control circuit 2 has the write buffers 102a, 102b and the read buffers 103a, 103b connected to a plurality of bit lines BL selected by the bit line selector 101. The write buffers 102a, 102b and the read buffers 103a, 103b are connected via the four switch NMOS transistors MN4 to MN7 and the data line DQ to the plurality of bit lines BL. These switch NMOS transistors MN4 to MN7 are also high withstand voltage transistors.

Also, the write buffers 102a, 102b and the read buffers 103a, 103b are connected via the data controllers 104a and 104b to the data input/output line IO. A read buffer 103 has a sense amplifier S/A internally. The sense amplifier S/A may be any of various types such as a single end type or a differential type using a reference cell.

[Operation of Control Circuit]

Next, the set operation and the reset operation in the column control circuit 2 configured in this way will be described below. If the bit lines BL<0> and BL<1> are selected, the corresponding selection word line is made at Vss (=0V).

The bit line BL<0> selected by the bit line selector 101 is connected to the write buffer 102a if the switch NMOS transistor MN4 is turned on by a write selection signal BLMS. Write data is inputted via the data controller 104a from the data input/output line IO into the write buffer 102a. The write buffer 102a applies a set pulse to the memory cell for which the set operation is performed, based on this data.

Also, the bit line BL<1> selected by the bit line selector 101 is connected to the write buffer 102b, if the switch NMOS transistor MN6 is turned on by a write selection signal BLWS. The write buffer 102b applies a reset pulse to the memory cell for which the reset operation is performed, based on a control signal.

Since such control circuit is provided, the reset operation is performed for the memory cell within one memory block, and the set operation is performed for the memory cell different from the memory cell for which the reset operation is performed. The set operation does not wait until the reset operation is completed, whereby the time required for the operation of the variable resistive memory device can be shortened. That is, the variable resistive memory device according to this embodiment can increase the processing speed in performing the set operation and the reset operation for the memory cell array 1.

Fifth Embodiment

A basic configuration of the variable resistive memory device according to a fifth embodiment is the same as the variable resistive memory device according to the first embodiment.

[Operation of Variable Resistive Memory Device]

Figure 21:
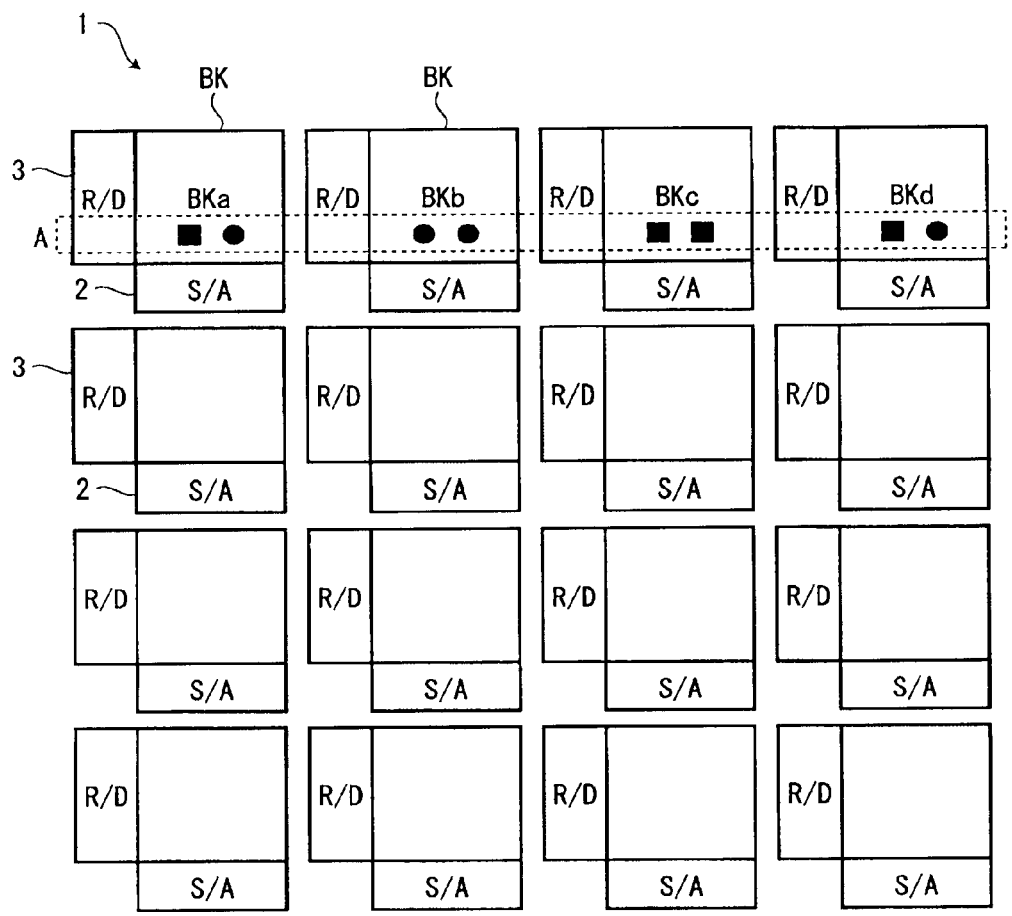
FIG. 21 is a schematic view showing a plurality of memory cell arrays arranged in matrix on the silicon substrate according to a fifth embodiment.

The reset operation and the read operation for the memory cell array 1 in the variable resistive memory device according to the fifth embodiment will be described below. The variable resistive memory device according to this embodiment has a plurality of memory cells selected simultaneously within one memory block BK as a basic unit. That is, the variable resistive memory device according to this embodiment performs the reset operation and the read operation for the plurality of memory cells within one memory block BK at the same time. FIG. 21 is a view showing the plurality of memory blocks BK arranged in matrix on a silicon substrate. In the memory cell array 1 as shown in FIG. 21, the same reference signs are attached to the parts having the same configuration as the first embodiment, the explanation of which is omitted. In FIG. 21, the memory cell within the memory block BK for which the reset operation is performed is indicated by the circle sign and the memory cell for which the read operation is performed is indicated by the rectangle sign.

In the reset operation and the read operation for the variable resistive memory device as shown in FIG. 21, the reset operation and the read operation are performed for the plurality of memory blocks BK selected by the address signal A. In one memory block $BK_b$, the same operation (e.g., reset operation) is performed for the different memory cells in parallel. Also, in the other memory block $BK_c$ the same operation (e.g., read operation) is performed for the different memory cells in parallel. And in the other memory blocks $BK_a$ and $BK_d$, the different operations (e.g., reset operation and read operation) are performed for the different memory cells. The reset operation and the read operation for the plurality of memory blocks BK selected by the address signal A are performed at the same time, as shown in FIG. 21.

Herein, since the time required for the read operation is shorter than the time required for the reset operation, the read operation for another memory cell is ended before the reset operation for one memory cell. In this case, a signal designating another memory cell is supplied via the address signal line to the column control circuit 2 and the row control circuit 3, and a signal dictating the read operation is supplied via the control signal line to the column control circuit 2 and the row control circuit 3. Also, data read from another memory cell is supplied to the column control circuit 2 and the row control circuit 3, and outputted via the data input/output line IO to external. Thereby, the read operation for the different memory cell from the memory cell for which the reset operation is performed is performed successively.

In this way, in the variable resistive memory device according to this embodiment, the reset operation is performed for one memory cell, and the read operation is performed for another memory cell. The read operation does not wait until the reset operation is completed, whereby the time required for the operation of the variable resistive memory device can be shortened. That is, the variable resistive memory device according to this embodiment can increase the processing speed in performing the reset operation and the read operation for the memory cell array 1.

[Configuration and Operation of Control Circuit]

Figure 22:
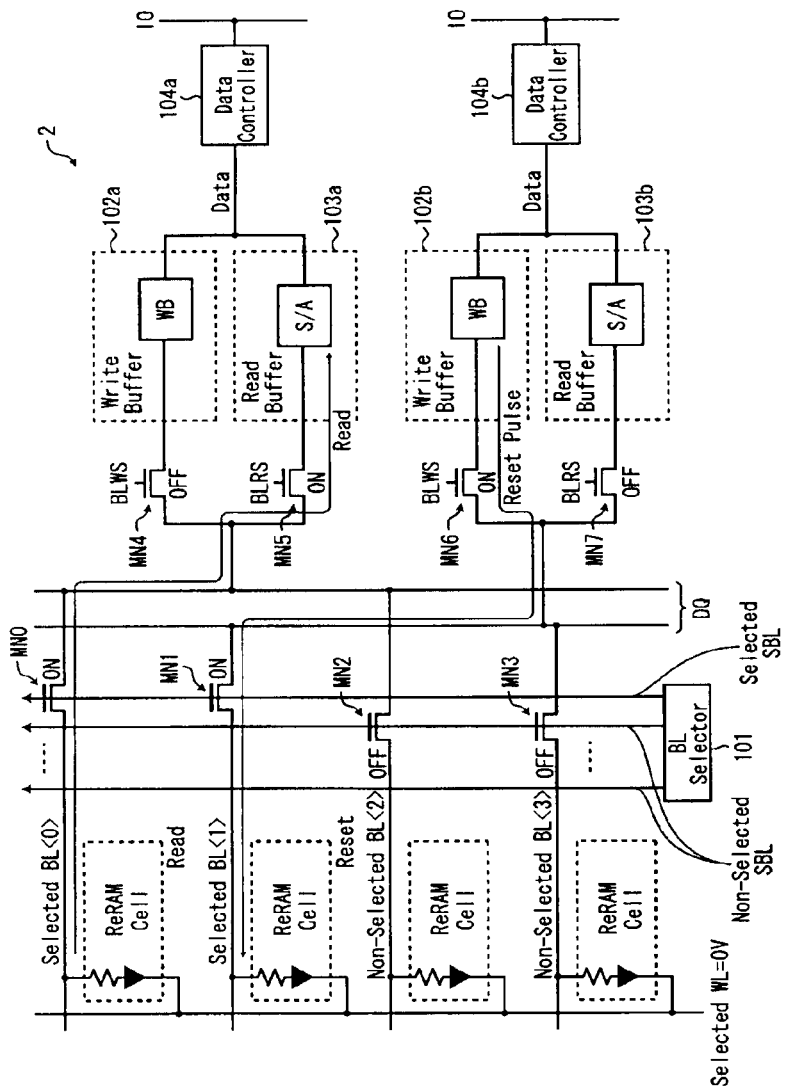
FIG. 22 is a circuit diagram showing the configuration of the column control circuit according to the fifth embodiment.

The operation of a control circuit for performing such operation for the memory cell array 1 will be described below. FIG. 22 shows the configuration of the column control circuit 2 comprising a read/write circuit. Since the column control circuit 2 as shown in FIG. 22 is the same configuration as the column control circuit 2 of the fourth embodiment, the same reference signs are attached to the same parts, the explanation of which is omitted.

The reset operation and the read operation in the column control circuit 2 will be described below. If the bit lines BL<0> and BL<1> are selected, the corresponding selection word line is made at Vss (=0V).

The bit line BL<0> selected by the bit line selector 101 is connected to the read buffer 103a if the switch NMOS transistor MN5 is turned on by a read selection signal BLRS. A signal of current value flowing through the memory cell is supplied to a sense amplifier S/A of the read buffer 103a. The sense amplifier S/A reads data written in the memory cell from this signal of current value and outputs it via the data controller 104a to the data input/output line IO.

Also, the bit line BL<1> selected by the bit line selector 101 is connected to the write buffer 102b if the switch NMOS transistor MN6 is turned on by a write selection signal BLWS. The write buffer 102b applies a reset pulse to the memory cell for which the reset operation is performed, based on a control signal.

Since such control circuit is provided, the reset operation is performed for the memory cell within one memory block, and the read operation is performed for the memory cell different from the memory cell for which the reset operation is performed. The read operation does not wait until the reset operation is completed, whereby the time required for the operation of the variable resistive memory device can be shortened. That is, the variable resistive memory device according to this embodiment can increase the processing speed in performing the reset operation and the read operation for the memory cell array 1.

Sixth Embodiment

A basic configuration of the variable resistive memory device according to a sixth embodiment is the same as the variable resistive memory device according to the first embodiment.

[Operation of Variable Resistive Memory Device]

The set operation and the read operation for the memory cell array 1 in the variable resistive memory device according to the sixth embodiment will be described below. The variable resistive memory device according to this embodiment has a plurality of memory cells selected simultaneously within one memory block BK as a basic unit as in the fourth embodiment. That is, the variable resistive memory device according to this embodiment performs the set operation and the read operation for the plurality of memory cells within one memory block BK at the same time.

Figure 23:
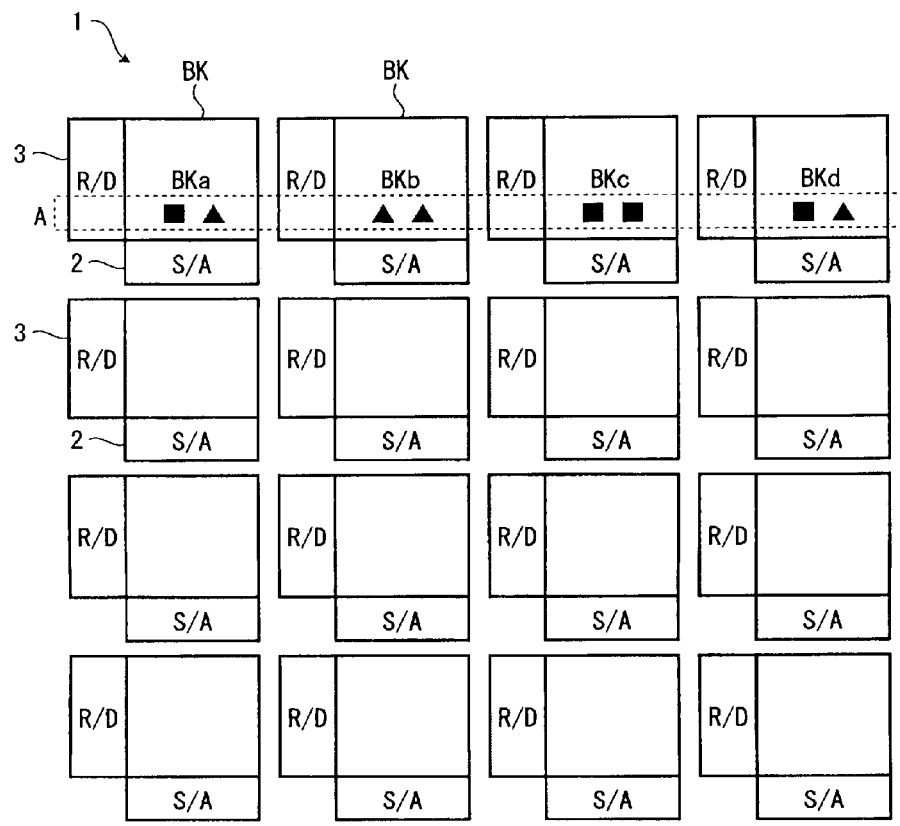
FIG. 23 is a schematic view showing a plurality of memory cell arrays arranged in matrix on the silicon substrate according to a sixth embodiment.

FIG. 23 is a view showing the plurality of memory blocks BK arranged in matrix on a silicon substrate. In the memory cell array 1 as shown in FIG. 23, the same reference signs are attached to the parts having the same configuration as the first embodiment, the explanation of which is omitted. In FIG. 23, the memory cell within the memory block BK for which the set operation is performed is indicated by the triangle sign and the memory cell for which the read operation is performed is indicated by the rectangle sign.

In the set operation and the read operation for the variable resistive memory device as shown in FIG. 23, the set operation and the read operation are performed for the plurality of memory blocks BK selected by the address signal A. In one memory block $BK_b$, the same operation (e.g., set operation) is performed for the different memory cells in parallel. Also, in the other memory block $BK_c$ the same operation (e.g., read operation) is performed for the different memory cells in parallel. And in the other memory blocks $BK_a$ and $BK_d$, the different operations (e.g., set operation and read operation) are performed for the different memory cells. Herein, the set operation and the read operation for the plurality of memory blocks BK selected by the address signal A are performed at the same time.

In this way, in the variable resistive memory device according to this embodiment, the set operation is performed for one memory cell, and the read operation is performed for another memory cell. The read operation does not wait until the set operation is completed, whereby the time required for the operation of the variable resistive memory device can be shortened. That is, the variable resistive memory device according to this embodiment can increase the processing speed in performing the set operation and the read operation for the memory cell array 1.

[Configuration and Operation of Control Circuit]

Figure 24:
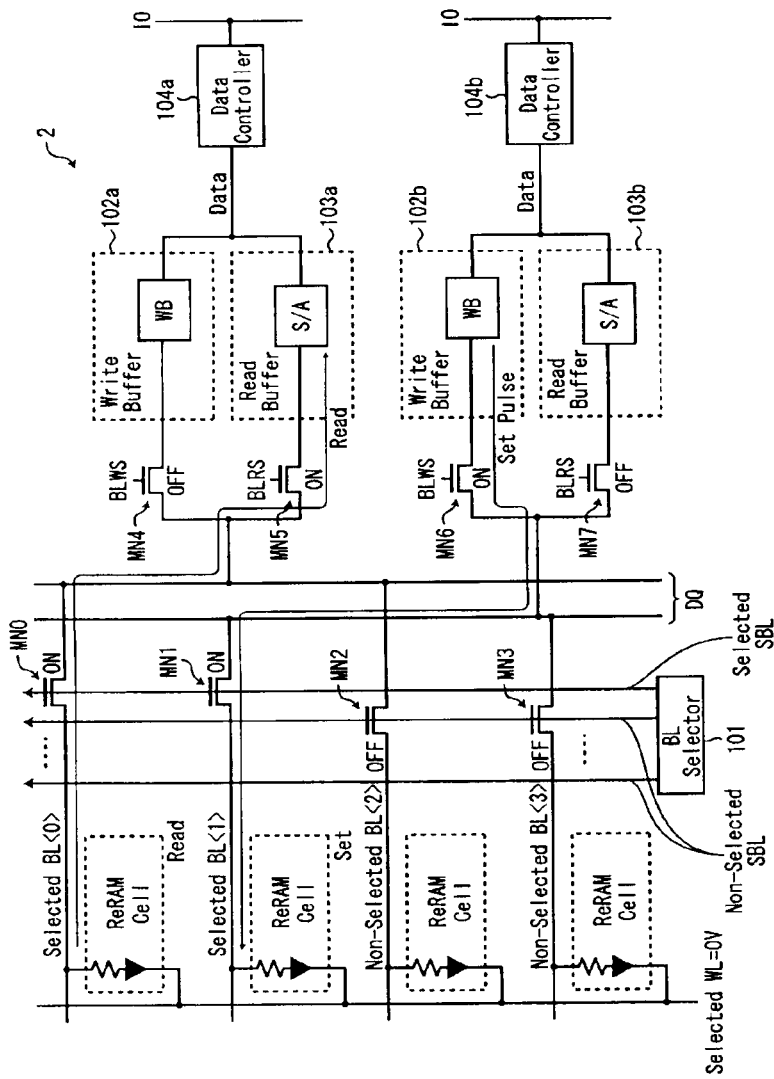
FIG. 24 is a circuit diagram showing the configuration of the column control circuit according to the sixth embodiment.

The operation of a control circuit for performing such operation for the memory cell array 1 will be described below. FIG. 24 shows the configuration of the column control circuit 2 comprising a read/write circuit. Since the column control circuit 2 as shown in FIG. 24 is the same configuration as the column control circuit 2 of the fourth embodiment, the same reference signs are attached to the same parts, the explanation of which is omitted.

The set operation and the read operation in the column control circuit 2 will be described below. If the bit lines BL<0> and BL<1> are selected, the corresponding selection word line is made at Vss (=0V).

The bit line BL<0> selected by the bit line selector 101 is connected to the read buffer 103a if the switch NMOS transistor MN5 is turned on by a read selection signal BLRS.

A signal of current value flowing through the memory cell is supplied to a sense amplifier S/A of the read buffer 103a. The sense amplifier S/A reads data written in the memory cell from this signal of current value and outputs it via the data controller 104a to the data input/output line IO.

The bit line BL<1> selected by the bit line selector 101 is connected to the write buffer 102b if the switch NMOS transistor MN6 is turned on by a write selection signal BLWS. Write data is inputted via the data controller 104b from the data input/output line IO to the write buffer 102b. The write buffer 102b applies a set pulse to the memory cell for which the set operation is performed, based on this data.

Since such control circuit is provided, the set operation is performed for the memory cell within one memory block, and the read operation is performed for the memory cell different from the memory cell for which the set operation is performed. The read operation does not wait until the set operation is completed, whereby the time required for the operation of the variable resistive memory device can be shortened. That is, the variable resistive memory device according to this embodiment can increase the processing speed in performing the set operation and the read operation for the memory cell array 1.

Seventh Embodiment

The set operation, the reset operation and the read operation in this embodiment are performed for the plurality of memory blocks BK or the plurality of memory cells in the same way as the operations in the first to sixth embodiments.

[Set Operation of Variable Resistive Memory Device]

In the set operation of the variable resistive memory device according to the first to sixth embodiments, before the set operation was performed for the memory block BK, a reset pulse was applied in advance to every memory cell within the memory cell array 1, so that the memory cell array 1 was put in a reset state. The set operation was performed by applying a set pulse to only the memory cell designated by the address signal for the memory cell array 1 in this reset state. Therefore, when data was overwritten in the memory cell array 1 in a state where data was already written, the reset operation was required for the entire memory cell array 1. On the contrary, the variable resistive memory device according to this embodiment is different from the first to sixth embodiments in that this reset operation can be omitted in a program operation for data. The program operation for data in the variable resistive memory device according to this embodiment will be described below.

Figure 25:
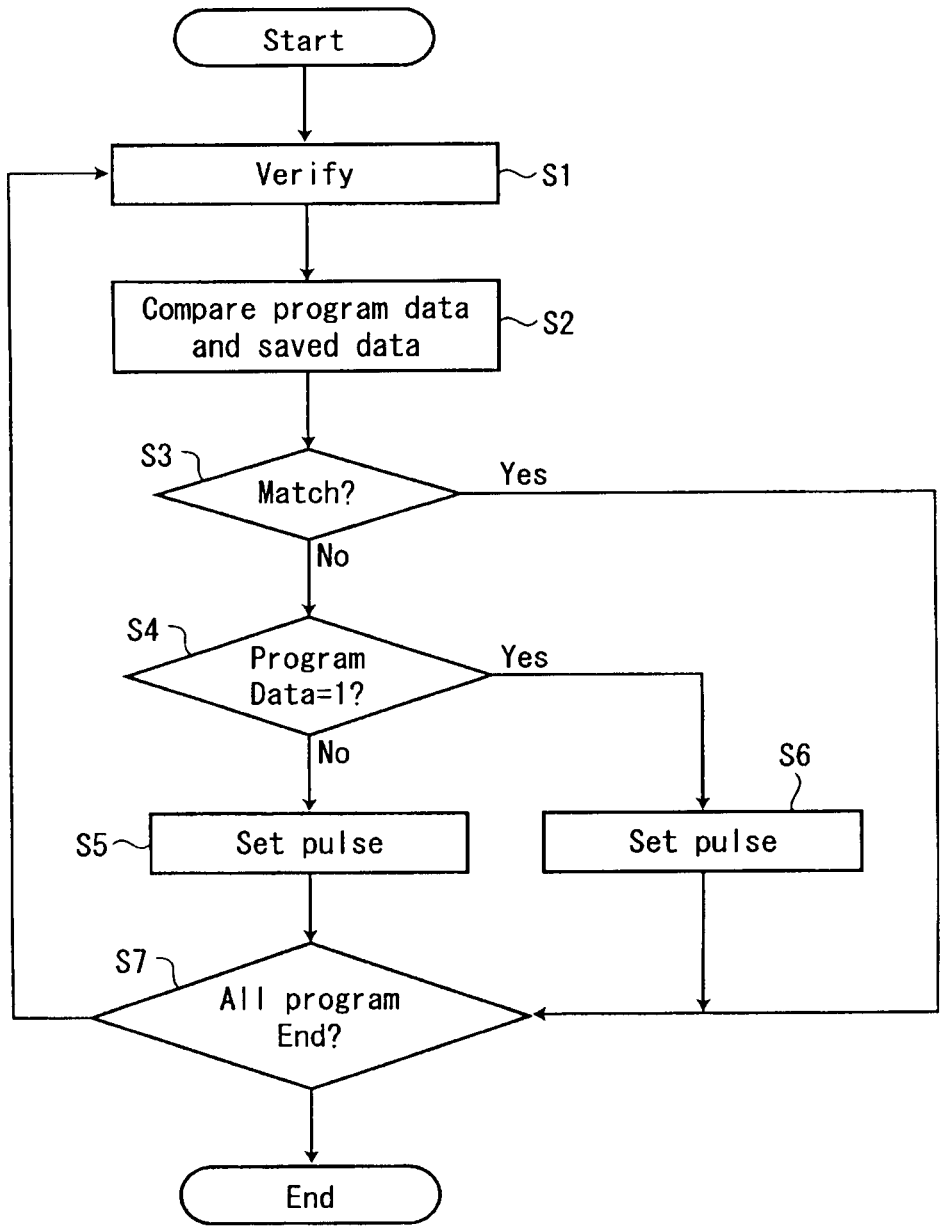
FIG. 25 is a flowchart for explaining a control sequence for the program operation in the variable resistive memory device according to a seventh embodiment.
Figure 26:
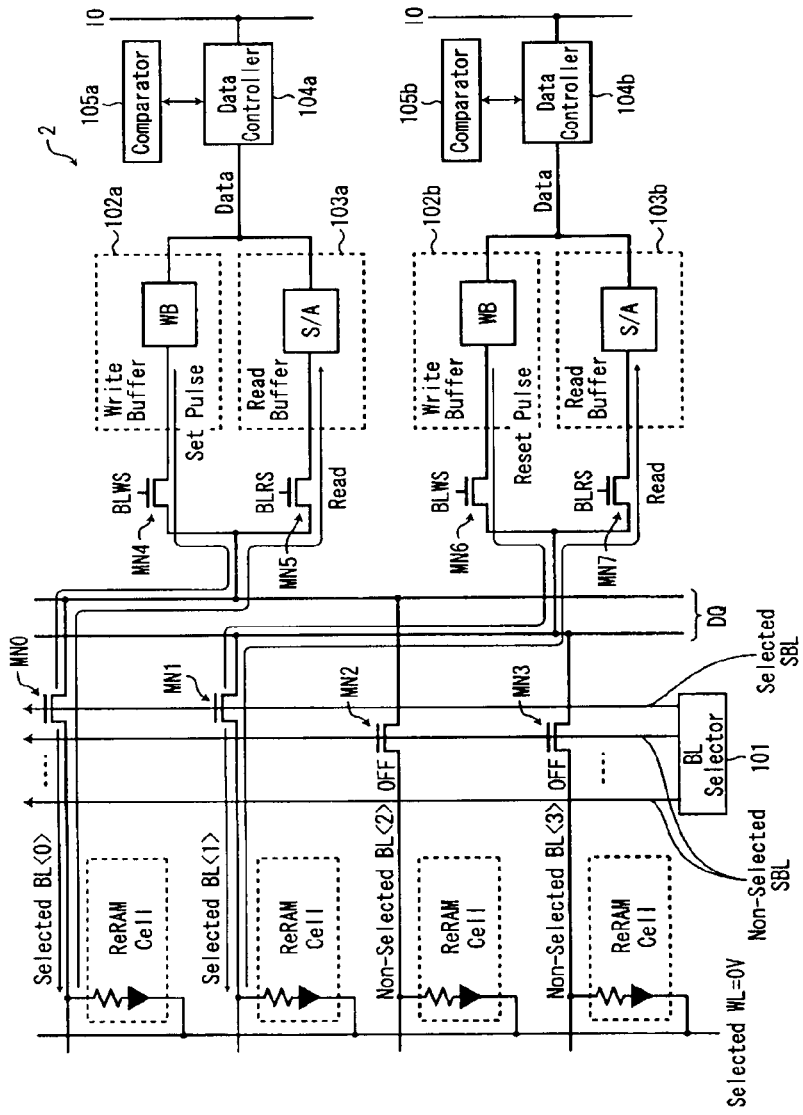
FIG. 26 is a circuit diagram showing the configuration of the column control circuit according to the seventh embodiment.

FIG. 25 is a flowchart for explaining a control sequence for the program operation in the variable resistive memory device according to the seventh embodiment. FIG. 26 is a circuit diagram showing the configuration of the column control circuit 2 comprising a read/write circuit. In the configuration of the column control circuit 2 as shown in FIG. 26, the same reference signs are attached to the parts having the same configuration as the column control circuit 2 of the fourth embodiment, the explanation of which is omitted.

The column control circuit 2 as shown in FIG. 26 is different from the column control circuit 2 of the fourth embodiment in that the comparators 105a and 105b for comparing data held in the memory cell designated by the address signal and write data into this memory cell are provided. The data write operation of the variable resistive memory device according to this embodiment will be described below, using the flowchart as shown in FIG. 25.

The variable resistive memory device starts the program operation of data for the memory cell array 1 upon a control signal supplied from an external host device. At step S1, a verification operation is performed for the memory cell designated by the address signal. Thereby, the column control circuit 2 reads data currently held in the memory cell designated by the address signal.

The bit lines BL<0> and BL<1> selected by the bit line selector 101 are connected to the read buffers 103a and 103b if the switch NMOS transistors MN5 and MN7 are turned on by a read selection signal BLRS, as shown in FIG. 26. A signal of current value flowing through the memory cell is supplied to a sense amplifier S/A of the read buffers 103a and 103b. The sense amplifier S/A reads data written in the memory cell from this signal of current value and outputs it via the data controllers 104a and 104b to the comparators 105a and 105b.

At step S2, data held in the memory cell designated by the address signal and write data into the memory cell are compared.

Write data is supplied from the data input/output line IO to the comparators 105a and 105b as shown in FIG. 26, in which the comparators 105a and 105b compare the data held in the memory cell and the write data into the memory cell.

At step S3, the comparators 105a and 105b judges whether or not the data held in the memory cell designated by the address signal is matched with the write data into this memory cell. If the data is matched, the procedure goes to step S7, or if the data is unmatched, the procedure goes to step S4.

At step S4, it is judged whether or not the write data into the memory cell designated by the address signal is "1" data. If the write data is not "1" data, the procedure goes to step S5, or if the write data is "1" data, the procedure goes to step S6.

At step S5, a set pulse is applied to the memory cell designated by the address signal.

The bit line BL<0> selected by the bit line selector 101 is connected to the write buffer 102a if the switch NMOS transistor MN4 is turned on by a write selection signal BLWS, as shown in FIG. 26. Write data "0" data is inputted via the data controller 104a from the data input/output line IO into the write buffer 102a. The write buffer 102a applies a set pulse to the memory cell for which the set operation is performed, based on this data. With this set pulse, the memory cell in a high-resistance state ("1" data state) is placed in a low-resistance state ("0" data state).

At step S6, a reset pulse is applied to the memory cell designated by the address signal.

Also, the bit line BL<1> selected by the bit line selector 101 is connected to the write buffer 102b if the switch NMOS transistor MN6 is turned on by a write selection signal BLWS, as shown in FIG. 26. Write data "1" data is inputted via the data controller 104b from the data input/output line IO into the write buffer 102b. The write buffer 102b applies a reset pulse to the memory cell for which the reset operation is performed, based on this data. With this reset pulse, the memory cell in a low-resistance state ("0" data state) is placed in a high-resistance state ("1" data state).

At step S7, it is judged whether or not all the data to be written into the memory cell array 1 during the program operation is written. If writing all the data is not ended, the procedure returns to step S1 to continue the write operation. If the write operation of all the data is ended, the program operation of data into the memory cell array 1 is ended.

The variable resistive memory device according to this embodiment performs the set operation, the reset operation and the read operation for the plurality of memory blocks BK or the plurality of memory cells at the same time. The read operation does not wait until the reset operation is completed, whereby the time required for the operation of the variable resistive memory device can be shortened. That is, the variable resistive memory device according to this embodiment can increase the processing speed in performing the set operation, the reset operation and the read operation for the memory cell array 1. Herein, the variable resistive memory device according to this embodiment reads the data of the memory cell array 1 in a state where the data is already written during the set operation and applies a set pulse or reset pulse to only the memory cell for which the rewrite is required. Because it is unnecessary to perform the reset operation for the memory cell array 1 before the write operation, the variable resistive memory device according to this embodiment can further increase the processing speed in performing the set operation for the memory cell array 1.

Though the embodiments of the invention have been described above, the invention is not limited to those embodiments, and various changes, additions and combinations may be possible without departing from the spirit or scope of the invention.

What is claimed is:

1. A semiconductor memory device comprising:
a plurality of cell arrays having a plurality of first wirings and a plurality of second wirings intersecting each other and memory cells disposed at intersections between said first wirings and said second wirings, each memory cell containing a variable resistive element that is electrically rewritable and stores a resistance value as data; and
a control circuit for selectively driving said first wirings and said second wirings;
wherein said control circuit performs:
a first operation of applying a voltage required for one operation selected from data write, read and erase operations to a first memory cell via a first combination of said first and second wirings,
a second operation of applying a voltage required for an operation selected from the data write, read and erase operations and different from the first operation to a second memory cell via a second combination of said first and second wirings, and
a third operation of applying a voltage required for an operation selected from the data write, read and erase operations and different from the first operation to a third memory cell via a third combination of said first and second wirings, and said second and third operations are performed after said first operation is initiated and before said first operation is completed,
wherein the first operation and second operation are performed for different memory blocks.

2. The semiconductor memory device according to claim 1, wherein the third operation is performed to a different memory block from the memory blocks to which the first operation and the second operation are performed.

3. A semiconductor memory device comprising:
a plurality of cell arrays having a plurality of first wirings and a plurality of second wirings intersecting each other and memory cells disposed at intersections between said first wirings and said second wirings, each memory cell containing a variable resistive element that is electrically rewritable and stores a resistance value as data; and
a control circuit for selectively driving said first wirings and said second wirings;
wherein said control circuit performs:
a first operation of applying a voltage required for one operation selected from data write, read and erase operations to a first memory cell via a first combination of said first and second wirings,
a second operation of applying a voltage required for an operation selected from the data write, read and erase operations and different from the first operation to a second memory cell via a second combination of said first and second wirings, and
a third operation of applying a voltage required for an operation selected from the data write, read and erase operations and different from the first operation to a third memory cell via a third combination of said first and second wirings, and said second and third operations are performed after said first operation is initiated and before said first operation is completed,
wherein the second operation and the third operation are performed in sequential.

4. A semiconductor memory device comprising:
a plurality of cell arrays having a plurality of first wirings and a plurality of second wirings intersecting each other and memory cells disposed at intersections between said first wirings and said second wirings, each memory cell containing a variable resistive element that is electrically rewritable and stores a resistance value as data; and
a control circuit for selectively driving said first wirings and said second wirings;
wherein said control circuit performs:
a first operation of applying a voltage required for one operation selected from data write, read and erase operations to a first memory cell via a first combination of said first and second wirings,
a second operation of applying a voltage required for an operation selected from the data write, read and erase operations and different from the first operation to a second memory cell via a second combination of said first and second wirings, and
a third operation of applying a voltage required for an operation selected from the data write, read and erase operations and different from the first operation to a third memory cell via a third combination of said first and second wirings, and said second and third operations are performed after said first operation is initiated and before said first operation is completed, wherein the second operation and the third operation are performed in parallel.

* * * * *